(12) United States Patent
Ozaki

(10) Patent No.: US 8,362,533 B2
(45) Date of Patent: Jan. 29, 2013

(54) SEMICONDUCTOR DEVICE INCLUDING A TRANSISTOR AND A FERROELECTRIC CAPACITOR

(75) Inventor: Tohru Ozaki, Shinagawa-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 239 days.

(21) Appl. No.: 12/869,502

(22) Filed: Aug. 26, 2010

(65) Prior Publication Data

US 2010/0320518 A1 Dec. 23, 2010

Related U.S. Application Data

(62) Division of application No. 12/109,817, filed on Apr. 25, 2008, now Pat. No. 7,812,384.

(30) Foreign Application Priority Data

Apr. 27, 2007 (JP) .................................. 2007-118908
May 29, 2007 (JP) .................................. 2007-141292

(51) Int. Cl.
    *H01L 21/02* (2006.01)
(52) U.S. Cl. ......... 257/295; 257/E27.104; 257/E21.649; 257/E21.644
(58) Field of Classification Search .................. 257/295, 257/E27.104, E21.649, E21.644
    See application file for complete search history.

(56) References Cited

U.S. PATENT DOCUMENTS

| 6,303,429 B1 | 10/2001 | Ishibashi et al. |
| 6,638,775 B1 | 10/2003 | Kweon |
| 6,724,026 B2 | 4/2004 | Jacob et al. |
| 2001/0034106 A1 | 10/2001 | Moise et al. |
| 2003/0222299 A1 | 12/2003 | Miura |
| 2004/0235259 A1 | 11/2004 | Celii et al. |
| 2006/0170019 A1 | 8/2006 | Ozaki et al. |
| 2008/0003700 A1* | 1/2008 | Wang et al. ........................ 438/3 |
| 2008/0191352 A1* | 8/2008 | Yu et al. ........................ 257/751 |

FOREIGN PATENT DOCUMENTS

| JP | 10-56143 | 2/1998 |
| JP | 2000-133633 | 5/2000 |
| JP | 2002-299583 | 10/2002 |
| JP | 2003-110095 | 4/2003 |

(Continued)

OTHER PUBLICATIONS

Tae-Wonk Kim et al., "High Performance Reversible Switching Characteristics of Single layer Polyfluorene derivatives for Nonvolatile Organic Memory Applications", Solid State and Nanoelectric Devices, IEDM Confidential, IEDM 2007, 3 pages.

Atsushi Miura et al., "Protein Templated BioNanoDot Floatin Gate Memory Fabrication", IEDM Confidential, 3 Pages.

Japanese Office Action issued Mar. 6, 2012, in Patent Application No. 2007-141292 (with English-language translation).

(Continued)

*Primary Examiner* — Thao Le
*Assistant Examiner* — Allen Parker
(74) *Attorney, Agent, or Firm* — Oblon, Spivak, McClelland, Maier & Neustadt, L.L.P.

(57) ABSTRACT

According to an aspect of the present invention, there is provided a semiconductor device including: a transistor including: a source, a drain and a gate; first and second plugs on the source and the drain; a third plug on the gate to have a top face higher than that of the first plug; an interlayer insulating film covering the transistor and the first to the third plugs; a ferroelectric capacitor on the interlayer insulating film, one electrode thereof being connected to the first plug; a barrier film covering surfaces of the ferroelectric capacitor and the interlayer insulating film to prevent a substance affecting the ferroelectric capacitor from entering therethrough; and fourth and fifth plugs disposed on the second and the third plugs and connected thereto through connection holes formed in the barrier film.

2 Claims, 32 Drawing Sheets

FOREIGN PATENT DOCUMENTS

| | | |
|---|---|---|
| JP | 2004-311703 | 11/2004 |
| JP | 2004-335537 | 11/2004 |
| JP | 2004-349424 | 12/2004 |
| JP | 2005-268472 | 9/2005 |
| JP | 2006-5234 | 1/2006 |
| JP | 2006-49795 | 2/2006 |

OTHER PUBLICATIONS

Japanese Office Action issued Mar. 6, 2012, in Patent Application No. 2007-118908 (with English-language translation).

Japanese Office Action issued Jun. 19, 2012, in Japan Patent Application No. 2007-118908 (with English translation).

* cited by examiner

SEMICONDUCTOR DEVICE INCLUDING A TRANSISTOR AND A FERROELECTRIC CAPACITOR

CROSS-REFERENCE TO RELATED APPLICATIONS

This application is a division of and claims the benefit of priority under 35 U.S.C. §120 from U.S. Ser. No. 12/109,817 filed Apr. 25, 2008, and claims the benefit of priority under 35 U.S.C. §119 from Japanese Patent Application No. 2007-118908 filed Apr. 27, 2007 and Japanese Patent Application No. 2007-141292 filed May 29, 2007, the entire contents of each of which are incorporated herein by reference.

BACKGROUND OF THE INVENTION

1. Field of the Invention

An aspect of the present invention relates to a semiconductor device including transistors and ferroelectric capacitors.

2. Description of the Related Art

As one nonvolatile semiconductor memory, attention is focused on ferroelectric random access memory (FeRAM) with memory cells each made up of a transistor and a ferroelectric capacitor, as disclosed in JP-A-2005-268472. This kind of ferroelectric random access memory adopts a COP (capacitor on plug) structure in which an electrode of the ferroelectric capacitor and a source/drain of the transistor are electrically connected by using of a contact plug from the viewpoint of area penalty.

Characteristic degradation of the ferroelectric capacitor easily occurs due to the reduction by the hydrogen. Thus, JP-A-2005-268472 further discloses a structure wherein a hydrogen barrier film for covering and protecting a ferroelectric capacitor is formed.

In ferroelectric random access memory having such ferroelectric capacitors, for example, an alumina film is used as a hydrogen barrier film and is formed in a film thickness of several ten nm to several hundred nm. A lower layer insulating film (interlayer insulting film) such as a silicon oxide film having a film thickness of several hundred nm is formed on a transistor and the hydrogen barrier film is formed on the lower layer insulating film. Further, an upper layer insulating film (interlayer insulting film) such as a silicon oxide film having a film thickness of several hundred nm is formed on the hydrogen barrier film. Metal wiring connected to the source or the drain of the transistor and metal wiring connected to the electrode of the ferroelectric capacitor are disposed on the upper layer insulating film. That is, metal wiring is disposed through the lower layer insulating film, the hydrogen barrier film, and the upper layer insulating film on the source and the drain of the transistor and the gate electrode.

A contact opening is formed in the upper layer insulating film, the hydrogen barrier film and the lower layer insulating film, and the metal wiring is electrically connected to the source or the drain of the transistor and the gate electrode through the contact opening. Generally, the contact opening is hard to manufacture, and the manufacturing of the contact opening negatively affects the yield in the manufacturing process of ferroelectric random access memory. Specifically, if the contact opening is manufactured with the etching condition of reactive ion etching (RIE) matched with a silicon oxide film, the etching rate of the hydrogen barrier film becomes extremely low as compared with the etching rate of the silicon oxide film. In such a manufacturing process condition, the etched cross-sectional shape of the hydrogen barrier film becomes like taper and the opening dimension of the bottom of the contact opening is extremely scaled down.

JP-A-2005-268472 also discloses a method for forming a tungsten (W) plug on the source/drain of a transistor, to which the ferroelectric capacitor is not connected, in a lower layer insulating film, and for forming a hydrogen barrier film just above the W plug. According to this method, since the tungsten (W) plug is formed in the lower layer insulating film, the lower layer insulating film having a thick film thickness does not exist between the W plug and the hydrogen barrier film. That is, the taper shape of the hydrogen barrier film whose RIE working is difficult to perform may be controlled in the film thickness range of several ten nm to several hundred nm and thus the bottom dimension of the contact opening can be increased and the cross-sectional shape of the contact opening can be controlled easily.

As finer design rules of ferroelectric random access memory proceed, for example, if the one-side size of a contact opening becomes less than 0.2 μm in the 130-nm generation of the minimum working dimension of the manufacturing process, the aspect ratio of the contact opening increases. This means that the ratio of the depth to the opening area of the contact opening increases. For example, the source/drain region of a transistor is formed of silicon (Si), and a barrier metal film is formed between the source/drain region and a W plug. The surface portion of the source/drain region is formed of, for example, a cobalt silicide (CoSi) layer. A layered film made up of a titanium (Ti) film and a titanium nitride (TiN) film deposited on the titanium (Ti) film is used as the barrier metal film. If the aspect ratio of the contact opening increases, the step coverage of the barrier metal film on the bottom and the inner wall of the contact opening decreases, and particularly the film thickness of the Ti film formed on a side wall becomes extremely thin. Consequently, coagulation of a titanium silicide (TiSi) film occurs in the contact opening by heat treatment accompanying the manufacturing process of a ferroelectric capacitor, and the action of reducing the precipitate of diffusion layer impurities onto the CoSi layer becomes insufficient. Such a phenomenon increases the resistance value in the contact opening, causing a contact failure to occur. The contact failure can be solved by increasing the film thickness of the Ti film of the barrier metal film and reducing the aspect ratio of the contact opening.

However, if the aspect ratio of the contact opening on the source/drain is reduced, the aspect ratio of the contact opening on the gate electrode is further reduced since the top of the gate is disposed above the source/drain. This means that the height of the W plug electrically connected to the gate electrode and formed in the contact opening becomes extremely low as much as the film thickness of the gate electrode. Since the hydrogen barrier film is hard to etch in the etching condition matched with the silicon oxide film as described above, a metal etching gas using a chlorine-based gas is used for RIE to etch the hydrogen barrier film. When using the metal etching gas, undesirable etching on the W plug disposed under the hydrogen barrier film is occur in the etching of the hydrogen barrier film. Here, when embedding the W plug in the contact opening according to an MOCVD method, a seam of the plug material is generated on the center portion of the contact opening, and the etching rate becomes extremely high on the seam. Therefore, in the W plug in the contact opening on the gate, the W plug is penetrated by an etching, and the etching reaches the gate electrode when the hydrogen barrier film is etched. For example, a layered film made up of a silicon polycrystalline film and a high melting point metal silicide film deposited on the silicon polycrystalline film is used as the gate electrode. If penetration of the W plug occurs, the etching proceeds to the high melting point metal silicide film of the gate electrode, and the electric connection between the gate electrode and the W plug becomes contact of the silicon polycrystalline film and the W plug and thus the resistance value not only varies, but also increases.

SUMMARY OF THE INVENTION

According to an aspect of the present invention, there is provided a semiconductor device including: a transistor including: a first main electrode, a second main electrode, and a control electrode; a first plug that is disposed on the first main electrode; a second plug that is disposed on the second main electrode; a third plug that is disposed on the control electrode and has a top face set higher than a top face of the first plug; an interlayer insulating film that is disposed to cover the transistor, the first plug, the second plug and the third plug; a ferroelectric capacitor including: a first electrode that is disposed on the interlayer insulating film and is electrically connected to the first plug, a second electrode that is separated from the first electrode, and a ferroelectric film that is disposed between the first electrode and the second electrode; a barrier film that covers a surface of the ferroelectric capacitor and a surface of the interlayer insulating film and prevents a substance affecting a crystalline composition or a polarization characteristic of a ferroelectric from entering therethrough; a fourth plug that is disposed on the second plug and is electrically connected to the second plug through a first connection hole disposed in the barrier film; and a fifth plug that is disposed on the third plug and is electrically connected to the third plug through a second connection hole disposed in the barrier film.

According to another aspect of the present invention, there is provided a semiconductor device including: a transistor including: a first main electrode, a second main electrode, and a control electrode; a first plug that is disposed on the first main electrode; a second plug that is disposed on the second main electrode; a third plug that is disposed on the control electrode; an interlayer insulating film that is disposed to cover the transistor, the first plug, the second plug and the third plug; a ferroelectric capacitor including: a first electrode that is disposed on the interlayer insulating film and is electrically connected to the first plug, a second electrode that is separated from the first electrode, and a ferroelectric film that is disposed between the first electrode and the second electrode; a barrier film that covers a surface of the ferroelectric capacitor and a surface of the interlayer insulating film and prevents a substance affecting a crystalline composition or a polarization characteristic of a ferroelectric from entering therethrough; a fourth plug that is disposed on the second plug and is electrically connected to the second plug through a first connection hole disposed in the barrier film; an eleventh plug that is disposed on the third plug below the barrier film; and a fifth plug that is disposed on the eleventh plug and is electrically connected to the eleventh plug through a second connection hole disposed in the barrier film.

BRIEF DESCRIPTION OF THE DRAWINGS

Embodiment may be described in detail with reference to the accompanying drawings, in which.

DETAILED DESCRIPTION OF THE INVENTION

Figure 1:
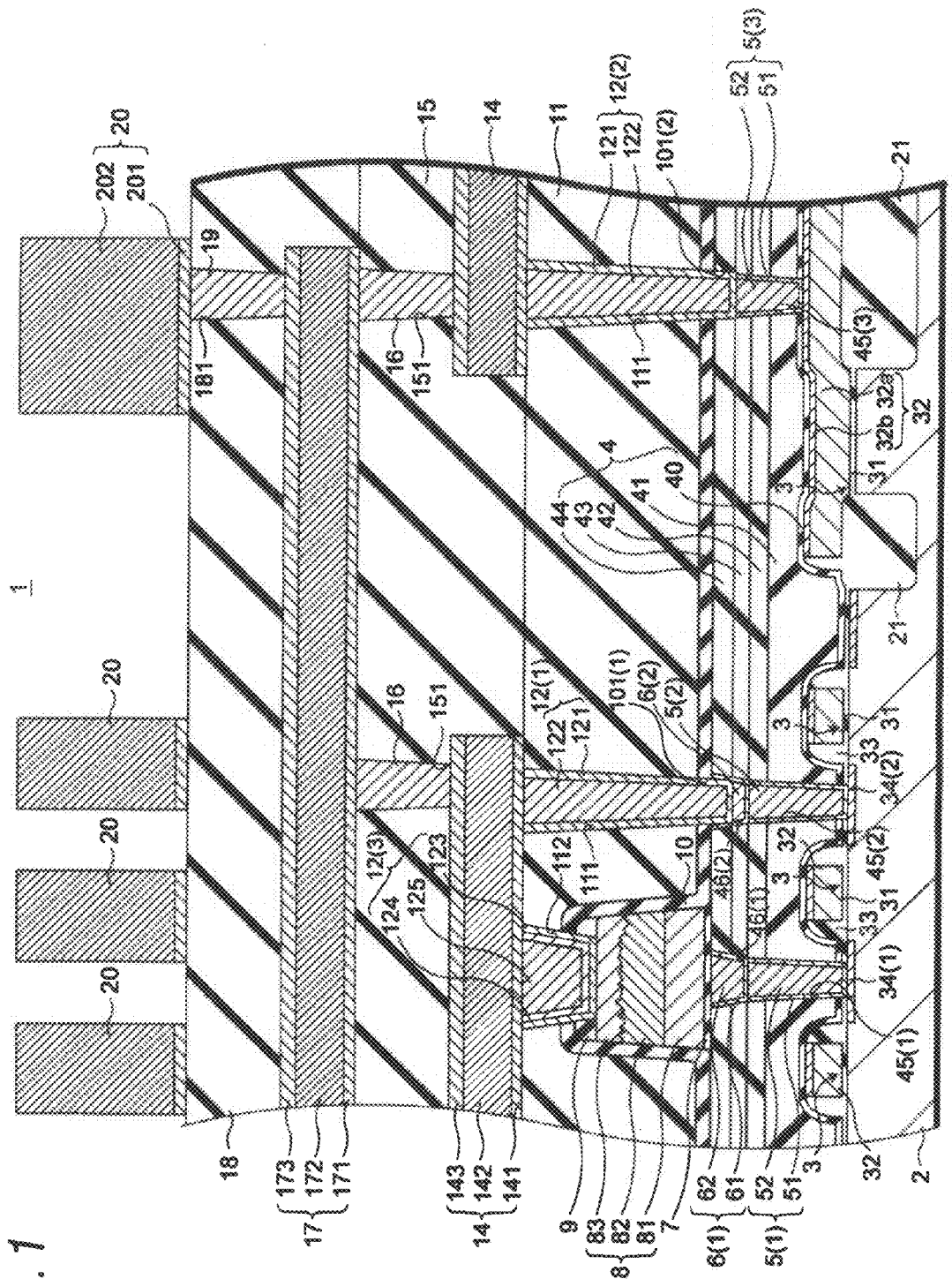
FIG. 1 is a cross-sectional structure drawing of ferroelectric random access memory according to a first embodiment.

Embodiments of the invention will be discussed with reference to the accompanying drawings. A semiconductor device according to each embodiment will be discussed by taking ferroelectric random access memory as an example. In the embodiments, identical components are denoted by the same reference numerals and duplicate description of the identical components among the embodiments is skipped.

First Embodiment

Circuit Configuration of Ferroelectric Random Access Memory

Figure 2:
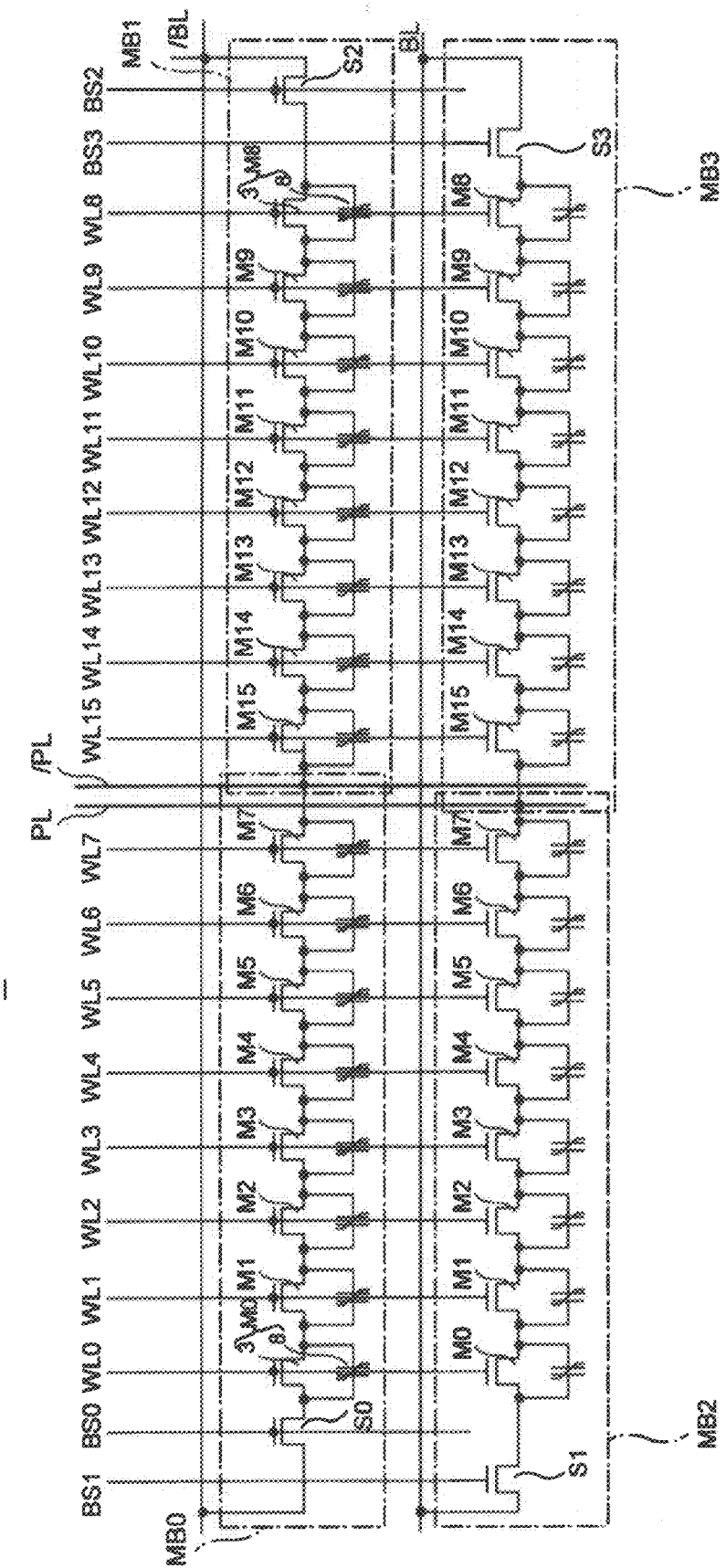
FIG. 2 is a circuit diagram of the ferroelectric random access memory according to the first embodiment.

Ferroelectric random access memory 1 according to a first embodiment has a Chain-FeRAM™ structure shown in FIG. 2. In the ferroelectric random access memory 1, a memory cell M includes one transistor 3 and one ferroelectric capacitor 8 connected in parallel each other and stores one-bit information. That is, one of main electrodes of the transistor 3 and one electrode of the ferroelectric capacitor 8 are electrically connected and the other main electrode of the transistor 3 and the other electrode of the ferroelectric capacitor 8 are electrically connected. In the first embodiment, an n-channel conductive insulated-gate field-effect transistor (IGFET) is used as the transistor 3. The IGFET includes, for example, MOS-FET and MISFET.

In the ferroelectric random access memory 1, memory blocks MB0, MB1, MB2, MB3, . . . each made up of the described memory cells M are arranged like a matrix to form a memory cell array. In the first embodiment, the memory block MB0 includes a memory string (memory cell string) having eight memory cells M0 to M7 electrically connected in series and a block select transistor S0 electrically connected in series to the memory cell M0 at one end of the memory string. A bit line /BL is electrically connected to the block select transistor S0 of the memory block MB0 and a plate line /PL is electrically connected to the memory cell M7 at the other end of the memory string. Word lines WL0 to WL7 are electrically connected to control electrodes (gate electrodes) of the memory cells M0 to M7. The word lines WL0 to WL7 are connected to a word decoder through a word driver circuit although not shown in the figure.

Likewise, the memory block MB1 includes a memory string having eight memory cells M8 to M15 electrically connected in series and a block select transistor S2 electrically connected in series to the memory cell M8 at one end of the memory string. A bit line /BL similar to the bit line /BL connected to the memory block MB0 is electrically connected to the block select transistor S2 of the memory block MB1 and a plate line /PL similar to the plate line /PL connected to the memory block MB0 is electrically connected to the memory cell M15 at the other end of the memory string. This means that the memory blocks MB0 and MB1 are electrically connected to the same plate line /PL and are placed symmetrically with respect to the plate line /PL. Word lines WL8 to WL15 are electrically connected to control electrodes (gate electrodes) of the memory cells M8 to M15. The word lines M8 to M15 are connected to a word decoder through a word driver circuit.

Like the memory block MB0, the memory block MB2 includes a memory string having eight memory cells M0 to M7 electrically connected in series and a block select transistor S1 electrically connected in series to the memory cell M7 at one end of the memory string. A bit line /BL connected to the memory block MB0 and a bit line BL to which an inversion signal is input are electrically connected to the block select transistor S1 of the memory block MB2 and a plate line /PL connected to the memory block MB0 and a plate line PL to which an inversion signal is input are electrically connected to the memory cell M7 at the other end of the memory string. The memory block MB3 includes a memory string having eight memory cells M8 to M15 electrically connected in series and a block select transistor S3 electrically connected in series to the memory cell M8 at one end of the memory staring. A bit line BL similar to the bit line BL connected to the memory block MB2 is electrically connected to the block select transistor S3 of the memory block MB3 and a plate line PL similar to the plate line PL connected to the memory block MB2 is electrically connected to the memory cell M15 at the other end of the memory string. This means that the memory blocks MB2 and MB3 are electrically connected to the same plate line PL and are placed symmetrically with respect to the plate line PL.

Although not shown in FIG. 2, the bit lines /BL and BL are connected to a sense amplifier. The plate lines /PL and PL are connected to a plate line drive circuit.

[Configuration of Ferroelectric Random Access Memory]

As shown in FIG. 1, the ferroelectric random access memory 1 according to the first embodiment has a substrate 2 as a main body. The ferroelectric random access memory 1 includes a plurality of transistors 3 each having a first main electrode 34 (1) (source/drain) and a second main electrode 34 (2) (drain/source) and a control electrode 32 (gate), first plugs 5 (1) each disposed on the first main electrode 34 (1) of the transistor 3 and electrically connected to the first main electrode 34 (1), second plugs 5 (2) each disposed on the second main electrode 34 (2) and electrically connected to the second main electrode 34 (2), third plugs 5 (3) each disposed on the control electrode 32, electrically connected to the control electrode 32, and having a top face high as compared with the top face of the first plug 5 (1) and that of the second plug 5 (2), ferroelectric capacitors 8 each disposed on the first plug 5 (1) and having one electrode 81 electrically connected to the first plug 5 (1), a barrier film 10 covering the surfaces of the ferroelectric capacitors 8 and the tops of the transistors 3 containing the tops of the second plugs 5 (2) and the third plugs 5 (3) for preventing entry of substance having an effect on the crystalline composition of a ferroelectric 82 of the ferroelectric capacitor 8, fourth plugs 12 (1) each disposed on the second plug 5 (2) and electrically connected to the second plug 5 (2) through a first connection hole 101 (1) disposed in the barrier film 10, and fifth plugs 12 (2) each disposed on the third plug 5 (3) and electrically connected to the third plug 5 (3) through a second connection hole 101 (2) disposed in the barrier film 10.

The height of the top face of the first plug 5 (1), the height of the top face of the second plug 5 (2), and the height of the top face of the third plug 5 (3) mean the height from the principal surface of the substrate 2. In the first embodiment, the length from the top face to the bottom face of the third plug 5 (3) (effective plug height) is set shorter than that of the first plug 5 (1) and the second plug 5 (2), and is set larger than the thickness of the barrier film 10.

The ferroelectric random access memory 1 further includes sixth plugs 6 (1) each electrically connected to both the first plug 5 (1) and the one electrode 81 of the ferroelectric capacitor 8 therebetween and seventh plugs 6 (2) each electrically connected at one end to the second plug 5 (2) and electrically connected at the other end to the fourth plug 12 (1) through the connection hole 101 (1) between the second plug 5 (2) and the barrier film 10.

In the first embodiment, a semiconductor substrate, such as a p-type silicon monocrystalline substrate is used as the substrate 2. An n-type silicon monocrystalline substrate having p-type well regions may be used as the substrate 2. Element isolation regions 21 are disposed in inactive regions of the principal surface of the substrate 2. Each element isolation region 21 is implemented as a silicon oxide film provided by selectively oxidizing the principal surface of the substrate 2, for example. The element isolation region 21 can adopt a shallow trench isolation (STI) structure. The element isolation region 21 adopting the STI structure includes a trench disposed from the principal surface of the substrate 2 toward the depth direction thereof and an insulator buried in the trench.

The transistor 3 is disposed in an active region of the principal surface of the substrate 2 in the region surrounded by the element isolation region 21. That is, the transistor 3 includes the substrate 2 used as a channel formation region, a gate insulating film 31 on the channel formation region (the principal surface of the substrate 2), the control electrode (gate electrode) 32 on the gate insulating film 31, and the first main electrode 34 (1) and the second main electrode 34 (2) disposed separately on the principal surface of the substrate 2 on both sides of the control electrode 32.

In the first embodiment, a single-layer film such as a silicon oxide film, a silicon nitride film, or an oxynitride film or a composite film with at least two or more of these films deposited can be used as the gate insulating film 31. A composite film having a silicon polycrystalline film 32a and a high melting point metal silicide film 32b deposited on the film 32a, for example, can be used as the control electrode 32. Each of the first main electrode 34 (1) and the second main electrode 34 (2) has a silicon monocrystalline semiconductor region or at least a surface portion thereof implemented as a high melting point metal silicide film. To adopt a salicide structure, the high melting point metal silicide film 32b of the control electrode 32 and at least the surface portions of the first main electrode 34 (1) and the second main electrode 34 (2) are formed of the same material. In the first embodiment, for example, a cobalt silicide (CoSi) film can be used as the high melting point metal silicide film. A side wall spacer 33 is disposed on a side wall face of the control electrode 32. When the salicide structure is formed, the side wall spacer 33 prevents a short circuit between each of the first main electrode 34 (1) and the second main electrode 34 (2) and the control electrode 32.

The ferroelectric capacitor 8 includes one electrode (or first electrode or bottom electrode) 81, the ferroelectric 82 deposited on the electrode 81 and the other electrode (or second electrode or top electrode) 83 deposited on the ferroelectric 82. The electrode 81 is formed of an iridium (Ir) film, for example. For example, any of a platinum (pt) film, an iridium oxide ($IrO_2$) film, or a strontium ruthenium oxide (SRO) film can be used as the electrode 81. For example, a ferroelectric material of a lead-zirconate-titanate (PZT, such as Pb (Zr, Ti)$O_3$) film, a bismuth strontium tantalite (STB, such as $SrBi_2Ta_2O_9$) film, etc., can be used as the ferroelectric 82. The electrode 83 is formed of an $IrO_2$ film, for example. For example, any of a Pt film, an Ir film, or an SRO film can be used as the electrode 83.

The ferroelectric capacitor 8 is disposed on a barrier film (first barrier film or reaction prevention film) 7. More particularly, the bottom electrode 81 of the ferroelectric capacitor 8 is disposed directly on the surface of the barrier film 7. The barrier film 7 has electric conductivity and shuts off oxygen entering the ferroelectric 82 from beneath through the bottom electrode 81. Oxygen causes an effect on the crystalline composition of the ferroelectric 82. For example, a titanium aluminum nitride (TiAlN) film can be used as the barrier film 7. A titanium aluminum (TiAl) film, etc., can be also used as the barrier film 7.

A barrier film (second barrier film or reaction prevention film) 9 is disposed on the top electrode 83 of the ferroelectric capacitor 8. The barrier film 9 has electric conductivity and shuts off oxygen entering the ferroelectric 82 from above through the top electrode 83. For example, an aluminum oxide ($Al_2O_3$) film can be used as the barrier film 9.

In all area on the principal surface of the substrate 2 containing the transistors 3, an interlayer insulating film 4 is disposed below the barrier film 7 below the ferroelectric capacitor 8. In the first embodiment, the number of layers and the material of the interlayer insulating film 4 are not necessarily limited; the interlayer insulating film 4 is formed of a composite film with insulating films 40, 41, 42, 43 and 44 deposited in order. The insulating film 40 of the lowest layer is formed of a silicon nitride ($Si_3N_4$) film, for example. The insulating film 41 is disposed on the insulating film 40; for example, a silicon oxide ($SiO_2$) film, particularly, a boron phosphorus silicate glass (BPSG) film capable of promoting surface flattening can be used. The insulating film 42 is disposed on the insulating film 41; for example, an $SiO_2$ film, particularly, a tetra ethoxy silane (TEOS) film that can be formed at low temperature and has dense film quality can be used. The insulating film 43 is disposed on the insulating film 42; for example, an $SiO_2$ film, particularly, a TEOS film that can be formed at low temperature and has dense film quality can be used. The insulating film 44 is disposed on the insulating film 43; for example, an $SiO_2$ film, particularly, a TEOS film that can be formed at low temperature and has dense film quality can be used.

A barrier film (third barrier film or reaction prevention film) 10 is disposed on the ferroelectric capacitor 8 and on the interlayer insulating film 4 except the region where the ferroelectric capacitor 8 is disposed. The barrier film 10 covers the side surroundings of the ferroelectric capacitor 8, specifically the side surroundings of the electrode 81, the side surroundings of the ferroelectric 82 and the side surroundings of the electrode 83 and covers the side surroundings and the top face of the barrier film 9. The barrier film 10 has insulation properties and shuts off hydrogen entering the ferroelectric 82 from the surroundings thereof. Hydrogen has an effect on the crystalline composition of the ferroelectric 82. In the first embodiment, an $Al_2O_3$ film can be used as the barrier film 10.

The first plug 5 (1) is disposed in a connection hole (contact hole or via hole) 45 (1) disposed in the insulating films 40, 41 and 42 on the first main electrode 34 (1) of the transistor 3. The first plug 5 (1) includes a barrier metal layer 51 disposed along the inner wall of the connection hole 45 (1) and the first main electrode 34 (1) exposed from the bottom face thereof and a burying conductor 52 disposed on the barrier metal layer 51 for burying the inside of the connection hole 45 (1). A deposition film having a titanium (Ti) film and a titanium nitride (TiN) film deposited on the Ti film can be used as the barrier metal layer 51. For example, a tungsten (W) film can be used as the burying conductor 52. The sixth plug 6 (1) on the first plug 5 (1) is disposed in a connection hole (through hole or via hole) 46 (1) disposed in the insulating films 43 and 44. The sixth plug 6 (1) includes a barrier metal layer 61 disposed along the inner wall of the connection hole 46 (1) and the first plug 5 (1) exposed from the bottom face thereof and a burying conductor 62 disposed on the barrier metal layer 61 for burying the inside of the connection hole 46 (1). The barrier metal layer 61 is formed of the same material as the barrier metal layer 51, for example, and the burying conductor 62 is formed of the same material as the burying conductor 52.

The second plug 5 (2) is disposed in a connection hole 45 (2) disposed in the insulating films 40, 41 and 42 on the second main electrode 34 (2) of the transistor 3. Like the first plug 5 (1), the second plug 5 (2) includes a barrier metal layer 51 disposed along the inner wall of the connection hole 45 (2) and the second main electrode 34 (2) exposed from the bottom face thereof and a burying conductor 52 disposed on the barrier metal layer 51 for burying the inside of the connection hole 45 (2). The seventh plug 6 (2) on the second plug 5 (2) is disposed in a connection hole 46 (2) disposed in the insulating films 43 and 44. The seventh plug 6 (2) includes a barrier metal layer 61 disposed along the inner wall of the connection hole 46 (2) and the second plug 5 (2) exposed from the bottom face thereof and a burying conductor 62 disposed on the barrier metal layer 61 for burying the inside of the connection hole 46 (2).

The third plug 5 (3) is disposed in a connection hole 45 (3) disposed in the insulating films 40, 41, 42 and 43 on the control electrode 32 of the transistor 3, more particularly on the high melting point metal silicide film 32b. Like the first plug 5 (1), the third plug 5 (3) includes a barrier metal layer 51 disposed along the inner wall of the connection hole 45 (3) and the high melting point metal silicide film 32b exposed from the bottom face thereof and a burying conductor 52 disposed on the barrier metal layer 51 for burying the inside of the connection hole 45 (3). The height of the top face of each of the first plug 5 (1) and the second plug 5 (2) substantially matches the height of the top face of the insulating film 42. In contrast, the height of the top face of the third plug 5 (3) is substantially matched with the height of the top face of the insulating film 43 above the insulating film 42 and is high as compared with the height of the top face of each of the first plug 5 (1) and the second plug 5 (2). In other words, the effective length of the third plug 5 (3) is enlarged by the film thickness of the insulating film 43.

The first plug 5 (1) and the second plug 5 (2) are disposed in the same layer. In the first embodiment, the third plug 5 (3) is disposed in a different layer from the first plug 5 (1) and the second plug 5 (2); it is disposed in a layer above the first plug 5 (1) and the second plug 5 (2). The sixth plug 6 (1) on the first plug 5 (1) and the seventh plug 6 (2) on the second plug 5 (2) are disposed in the same layer. The sixth plug 6 (1) and the seventh plug 6 (2) are disposed in a different layer from the third plug 5 (3) and are disposed in a layer above the third plug 5 (3).

A portion of the control electrode 32 on the gate insulating film 31 in an active region is effectively functioning as the control electrode of the transistor 3. At least one end of the control electrode 32 in the gate length direction thereof is extended onto the element isolation region 21 and the extended region is functioning as a contact region for electrically connecting the third plug 5 (3) above the control electrode 32 to the control electrode 32. On the control electrode 32 of the transistor 3, the third plug 5 (3) with the height of the top face increased and the effective length is enlarged by the film thickness of the insulating film 43 is disposed in the interlayer insulating film 4 between the control electrode 32 and the barrier film 10.

The sixth plug 6 (1) is disposed on the first plug 5 (1) on the first main electrode 34 (1) of the transistor 3. The seventh plug 6 (2) is disposed on the second plug 5 (2) on the second main electrode 34 (2). That is, the first plug 5 (1) and the sixth plug 6 (1) stacked vertically at two stages are disposed on the first main electrode 34 (1) and the second plug 5 (2) and the seventh plug 6 (2) stacked vertically at two stages are disposed on the second main electrode 34 (2). In other words, the depth of each of the connection hole 45 (1) in which the first plug 5 (1) is disposed and the connection hole 46 (1) in which the sixth plug 6 (1) is disposed is made shallow, the aspect ratio of each of the connection holes 45 (1) and 46 (1) is set small, and the first plug 5 (1) disposed in the connection hole 45 (1) and the sixth plug 6 (1) disposed in the connection hole 46 (1) are stacked. Likewise, the depth of each of the connection hole 45 (2) in which the second plug 5 (2) is disposed and the connection hole 46 (2) in which the seventh plug 6 (2) is disposed is made shallow, the aspect ratio of each of the connection holes 45 (2) and 46 (2) is set small, and the second plug 5 (2) disposed in the connection hole 45 (2) and the seventh plug 6 (2) disposed in the connection hole 46 (2) are stacked. In the first embodiment, the aspect ratio of each of the connection holes 45 (1), 45 (2), 46 (1) and 46 (2) is set to 4 or less. In other words, each of the first plug 5 (1), the second plug 5 (2), the sixth plug 6 (1) and the seventh plug 6 (2) is formed to have the height four times or less the bottom dimension (bottom face diameter). The height of the top face of the third plug 5 (3) disposed on the control electrode 32 of the transistor 3 is set higher than the height of the top face of each of the first plug 5 (1) and the second plug 5 (2), but the effective length of the third plug 5 (3) is set shorter than the length of each of the first plug 5 (1) and the second plug 5 (2). Therefore, the height of the third plug 5 (3) from the surface of the control electrode 32 is set to four times or less the bottom dimension.

An interlayer insulating film 11 is disposed on the barrier film 10 in all area of the principal surface of the substrate 2. For example, an $SiO_2$ film, particularly, a TEOS film that can be formed at low temperature and has dense film quality can be used as the interlayer insulating film 11. A connection hole 112 is disposed on the ferroelectric capacitor 8 of the interlayer insulating film 11 and an eighth plug 12 (3) is disposed in the connection hole 112. In the first embodiment, the eighth plug 12 (3) includes a barrier metal layer 123 disposed along the side walls of the connection hole 112 and the surface of the top electrode 83 of the ferroelectric capacitor 8 exposed from the bottom face thereof, an intermediate film 124 on the barrier metal layer 123 and a burying conductor 125 on the intermediate film 124. For example, a TiN film can be used as the barrier metal layer 123. The intermediate film 124 is used to improve a wettability of the barrier metal layer 123 and the burying conductor 125 and a niobium nitride (NbN) film can be used as the intermediate film 124, for example. Aluminum (Al) can be used as the burying conductor 125, for example. For example, when W is used as the burying conductor 125, the intermediate film (NbN film) 124 may not be required.

In the interlayer insulating film 11, the fourth plug 12 (1) is disposed on the seventh plug 6 (2) on the second plug 5 (2). The fourth plug 12 (1) includes a barrier metal layer 121 disposed on the connection hole 111 in an interlayer insulating film 11, the first connection hole 101 (1) in the barrier film 10 and the seventh plug 6 (2) exposed from the first connection hole 101 (1) and a burying conductor 122 disposed on the barrier metal layer 121. In the interlayer insulating film 11, the fifth plug 12 (2) is disposed on the third plug 5 (3). The fifth plug 12 (2) includes a barrier metal layer 121 disposed on the connection hole 111 in the interlayer insulating film 11, the second connection hole 101 (2) in the barrier film 10 and the third plug 5 (3) exposed from the second connection hole 101 (2) and a burying conductor 122 disposed on the barrier metal layer 121. For example, a deposition film having a Ti film and a TiN film deposited on the Ti film can be used as the barrier metal layer 121. For example, a W film can be used as the burying conductor 122.

On the interlayer insulating film 11, wirings (first layer metal wirings) 14 electrically connected to the fourth plug 12 (1), the fifth plug 12 (2) and the eighth plug 12 (3) disposed in the interlayer insulating film 11 are disposed. In the first embodiment, the wiring 14 includes a barrier metal film 141, a wiring main body 142 on the barrier metal film 141 and a barrier metal film 143 on the wiring main body 142. For example, a deposition film having a Ti film and a TiN film deposited on the Ti film can be used as the barrier metal layer 141. For example, an Al film or an Al alloy film can be used as the wiring main body 142. For example, a deposition film having a Ti film and a TiN film deposited on the Ti film can be used as the barrier metal film 143 like the barrier metal layer 141.

An interlayer insulating film 15 is disposed in all area of the principal surface of the substrate 2 containing the wiring 14. For example, an $SiO_2$ film, particularly, a TEOS film that can be formed at low temperature and has dense film quality can be used as the interlayer insulating film 15. A ninth plug 16 buried in a connection hole 151 formed in the interlayer insulating film 15 is disposed on the wiring 14 in the interlayer insulating film 15. For example, a W film can be used as the ninth plug 16.

Wiring (second layer metal wiring) 17 electrically connected to the ninth plug 16 is disposed on the interlayer insulating film 15. In the first embodiment, the wiring 17 includes a barrier metal film 171, a wiring main body 172 on the barrier metal film 171 and a barrier metal film 173 on the wiring main body 172. For example, a deposition film having a Ti film and a TiN film deposited on the Ti film can be used as the barrier metal layer 171. For example, an Al film or an Al alloy film can be used as the wiring main body 172. For example, a deposition film having a Ti film and a TiN film deposited on the Ti film can be used as the barrier metal film 173 like the barrier metal layer 171.

An interlayer insulating film 18 is disposed in all area of the principal surface of the substrate 2 containing the wiring 17. For example, an $SiO_2$ film, particularly, a TEOS film that can be formed at low temperature and has dense film quality can be used as the interlayer insulating film 18. A tenth plug 19 buried in a connection hole 181 formed in the interlayer insulating film 18 is disposed on the wiring 17 in the interlayer insulating film 18. For example, a W film can be used as the tenth plug 19.

Wiring (third layer metal wiring) 20 electrically connected to the tenth plug 19 is disposed on the interlayer insulating film 18. In the first embodiment, the wiring 20 includes a barrier metal film 201 and a wiring main body 202 on the barrier metal film 201. For example, a deposition film having a Ti film and a TiN film deposited on the Ti film can be used as the barrier metal layer 201. For example, an Al film or an Al alloy film can be used as the wiring main body 202.

[Method For Manufacturing Ferroelectric Random Access Memory]

Next, a method for manufacturing the ferroelectric random access memory 1 according to the first embodiment described above will be discussed with FIGS. 3 to 14.

Figure 3:
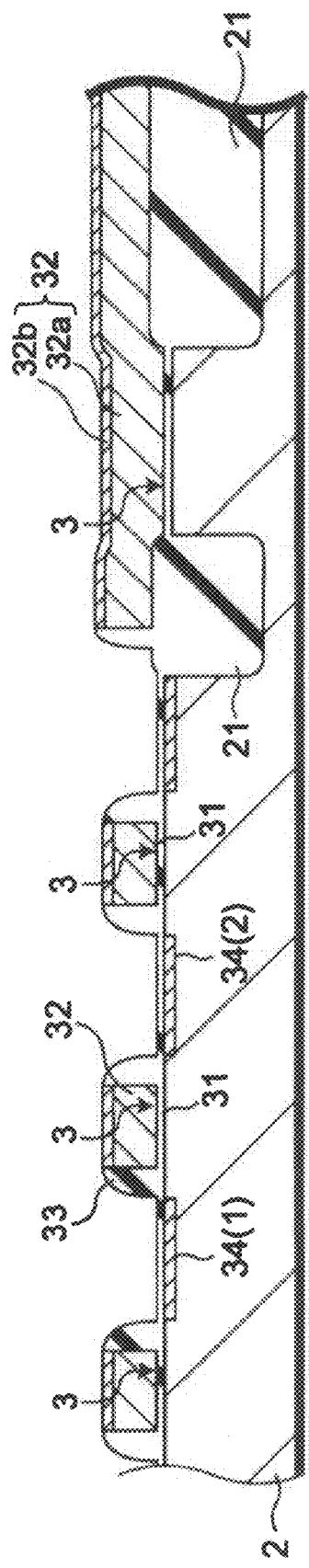
FIG. 3 is a sectional view to describe a first process step of a method for manufacturing the ferroelectric random access memory according to the first embodiment.

First, a substrate 2 is provided. Element isolation regions 21 are formed on the principal surface of an inactive region of the substrate 2 (see FIG. 3). The element isolation region 21 is formed of an $SiO_2$ film (LOCOS) provided by selectively thermally oxidizing the principal surface of the substrate 2 and growing the film thickness. As shown in FIG. 3, transistors 3 are formed using planar technique. To form the transistor 3, first a gate insulating film 31 is formed and subsequently an Si polycrystalline film 32a of a lower layer of a control electrode 32 and a side wall spacer 33 are formed in order. A high melting point metal silicide film 32b of an upper layer of the control electrode 32, a first main electrode 34 (1) and a second main electrode 34 (2) are formed using salicide technique and the transistor 3 can be completed.

Figure 4:
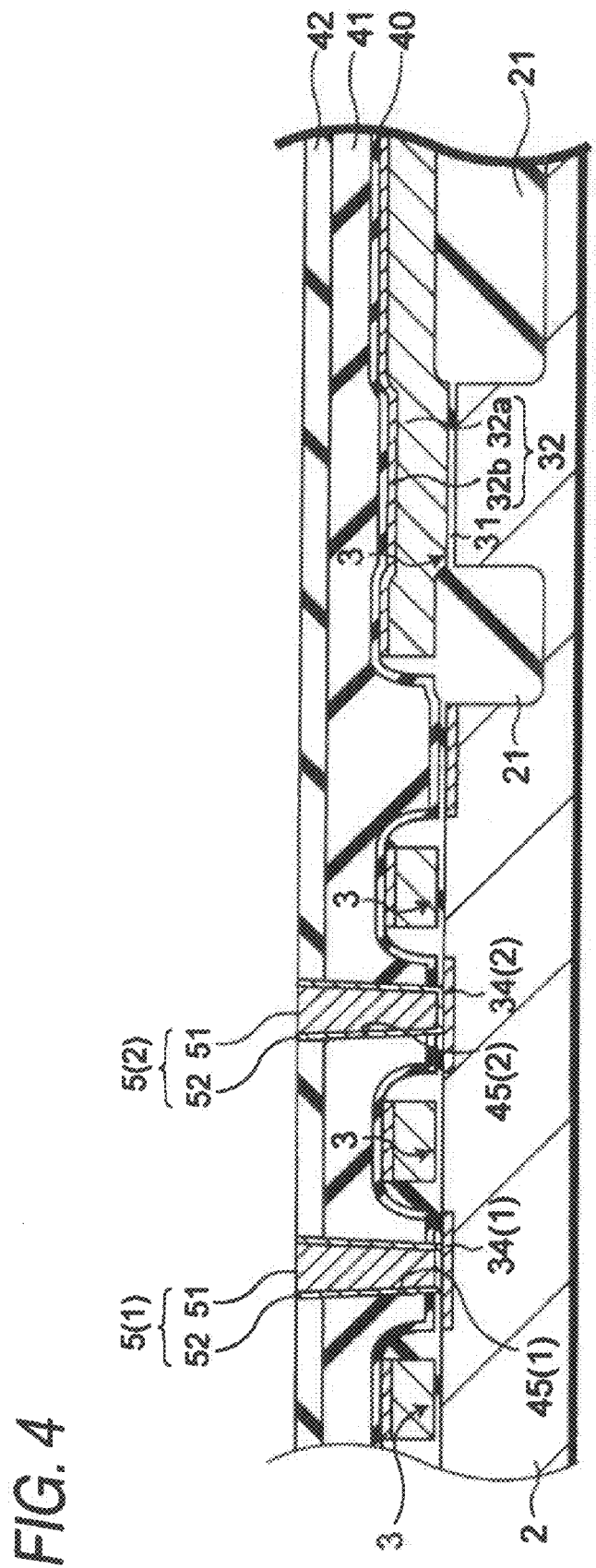
FIG. 4 is a sectional view to describe a second process step.

An insulating film 40 is formed in all area of the principal surface of the substrate 2 containing the transistors 3, more particularly the high melting point metal silicide films 32b of the control electrodes 32, the first main electrodes 34 (1) and the second main electrodes 34 (2) (see FIG. 4). An $Si_3N_4$ film formed by an LP-CVD method or a plasma CVD method and having a film thickness of about several ten nm can be used as the insulating film 40. Subsequently, insulating films 41 and 42 are formed in order on the insulating film 40. For example, a BPSG film is used as the insulating film 41 for the purpose of flattening, for example, and a TEOS film is used as the insulating film 42.

In the insulating films 40, 41 and 42, a connection hole 45 (1) is formed on the first main electrode 34 (1) and a connection hole 45 (2) is formed on the second main electrode 34 (2) (see FIG. 4). The connection holes 45 (1) and 45 (2) are formed by an anisotropic etching of RIE, etc., using a mask formed by a photolithography technique. This means that the connection holes 45 (1) and 45 (2) are formed in the same manufacturing step. In the method for manufacturing the ferroelectric random access memory 1 according to the first embodiment, the connection holes 45 (1) and 45 (2) are formed within the insulating films 40, 41 and 42 in the interlayer insulating film 4. Therefore, the depth of each of the connection holes 45 (1) and 45 (2) is made shallow and the aspect ratio of the ratio of the depth to the opening dimension can be reduced.

As shown in FIG. 4, a first plug 5 (1) electrically connected to the first main electrode 34 (1) is formed in the connection hole 45 (1). In the same manufacturing step, a second plug 5 (2) electrically connected to the second main electrode 34 (2) is formed in the connection hole 45 (2). To form the first plug 5 (1) and the second plug 5 (2), a barrier film 51 is formed on the side walls and the bottom face of each of the connection holes 45 (1) and 45 (2) and a burying conductor 52 is formed on the barrier film 51 and then excessive barrier film 51 and burying conductor 52 are removed using a CMP method.

Subsequently, an insulating film 43 is formed in all area of the principal surface of the substrate 2 containing the first plug 5 (1), the second plug 5 (2) and the insulating film 42. For example, a TEOS film can be used as the insulating film 43; preferably, a deposition film having an $Si_3N_4$ film formed at low pressure and a TEOS film formed at low pressure on the $Si_3N_4$ film can be used. A connection hole 45 (3) is formed on the control electrode 32 of the transistor 3 in the insulating films 40, 41, 42 and 43 (see FIG. 5). The connection hole 45 (3) is formed by an anisotropic etching of RIE, etc., using a mask formed by the photolithography technique. The connection hole 45 (3) is formed in a different manufacturing step from the step of forming the connection holes 45 (1) and 45 (2).

Figure 5:
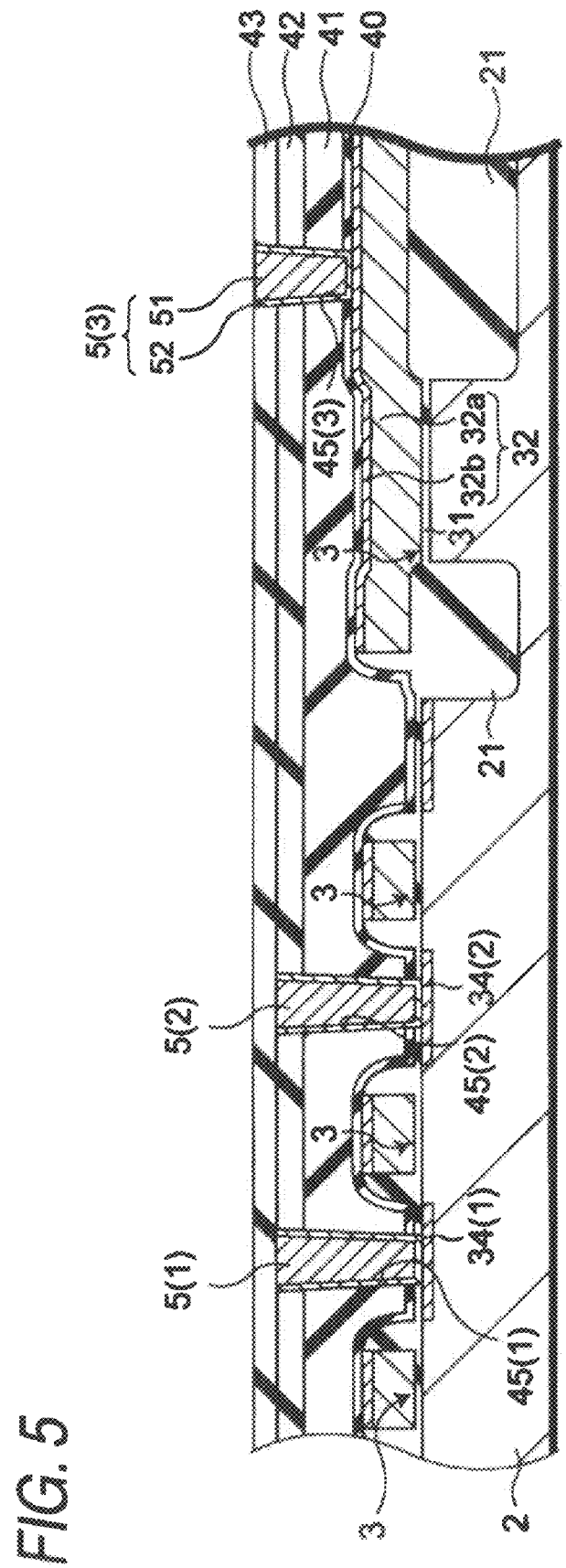
FIG. 5 is a sectional view to describe a third process step.

As shown in FIG. 5, a third plug 5 (3) electrically connected to the control electrode 32 is formed in the connection hole 45 (3). To form the third plug 5 (3), a barrier film 51 is formed on the side walls and the bottom face of the connection hole 45 (3) and a burying conductor 52 is formed on the barrier film 51 and then excessive barrier film 51 and burying conductor 52 are removed using the CMP method. The step of forming the third plug 5 (3) is set after the step of forming the first plug 5 (1) and the second plug 5 (2). In the first embodiment, the film thickness of the insulating film 43 is set thin as compared with that of the control electrode 32 and consequently the aspect ratio of the connection hole 45 (3) in which the third plug 5 (3) is formed is set smaller than the aspect ratio of the connection hole 45 (1) in which the first plug 5 (1) is formed and that of the connection hole 45 (2) in which the second plug 5 (2) is formed.

An insulating film 44 is formed in all area of the principal surface of the substrate 2 containing the third plug 5 (3) and the insulating film 43. For example, a TEOS film can be used as the insulating film 44; preferably, a deposition film having an $Si_3N_4$ film formed at low pressure and a TEOS film formed at low pressure on the $Si_3N_4$ film can be used (see FIG. 6). Here, the insulating film 44 is formed, whereby the interlayer insulating film 4 having the insulating films 40, 41, 42, 43 and 44 is formed.

Figure 6:
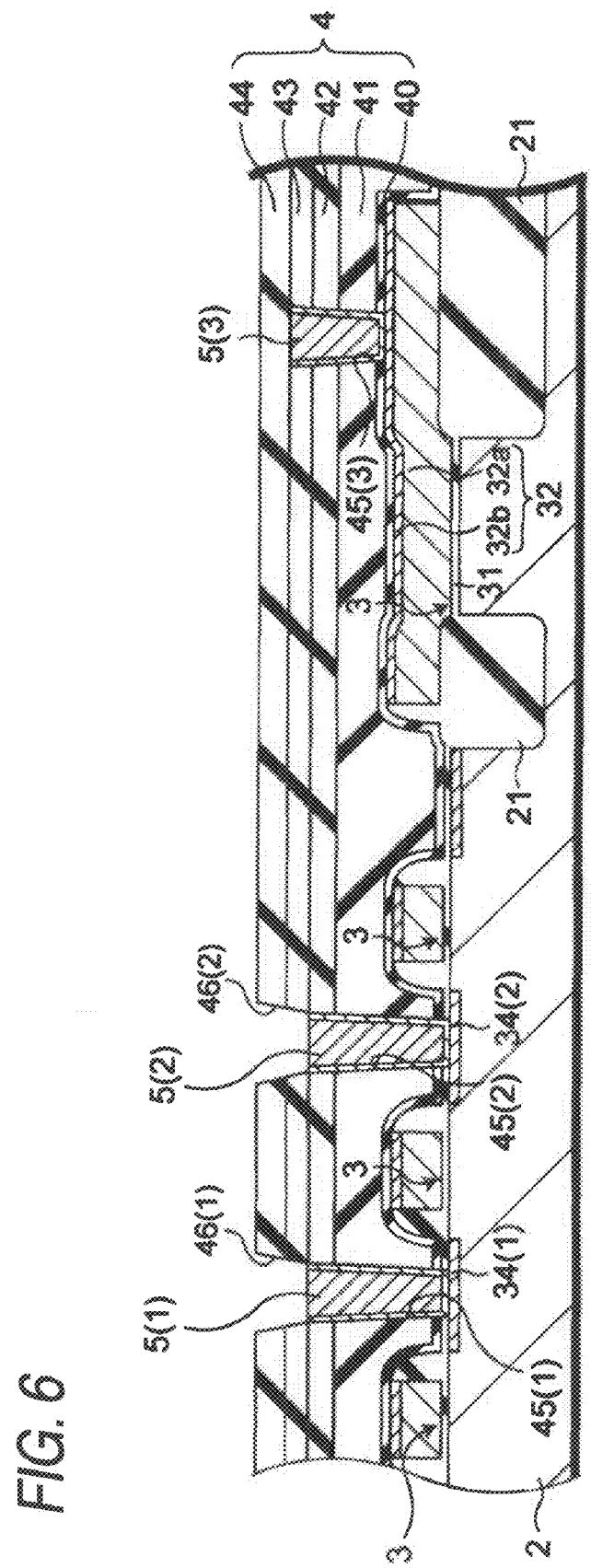
FIG. 6 is a sectional view to describe a fourth process step.

As shown in FIG. 6, a connection hole 46 (1) is formed in the insulating films 43 and 44 on the first plug 5 (1). In the same manufacturing step, a connection hole 46 (2) is formed in the insulating films 43 and 44 on the second plug 5 (2). The connection holes 46 (1) and 46 (2) are formed in the same manufacturing step. The connection holes 46 (1) and 46 (2) are formed by an anisotropic etching of RIE, etc., using a mask formed by the photolithography technique. In the first embodiment, the opening size of the connection hole 46 (1) is formed in the same dimension as the opening size of the connection hole 45 (1) in which the first plug 5 (1) below the connection hole 46 (1) is disposed. Likewise, the opening size of the connection hole 46 (2) is formed in the same dimension as the opening size of the connection hole 45 (2) in which the second plug 5 (2) below the connection hole 46 (2) is disposed.

Figure 7:
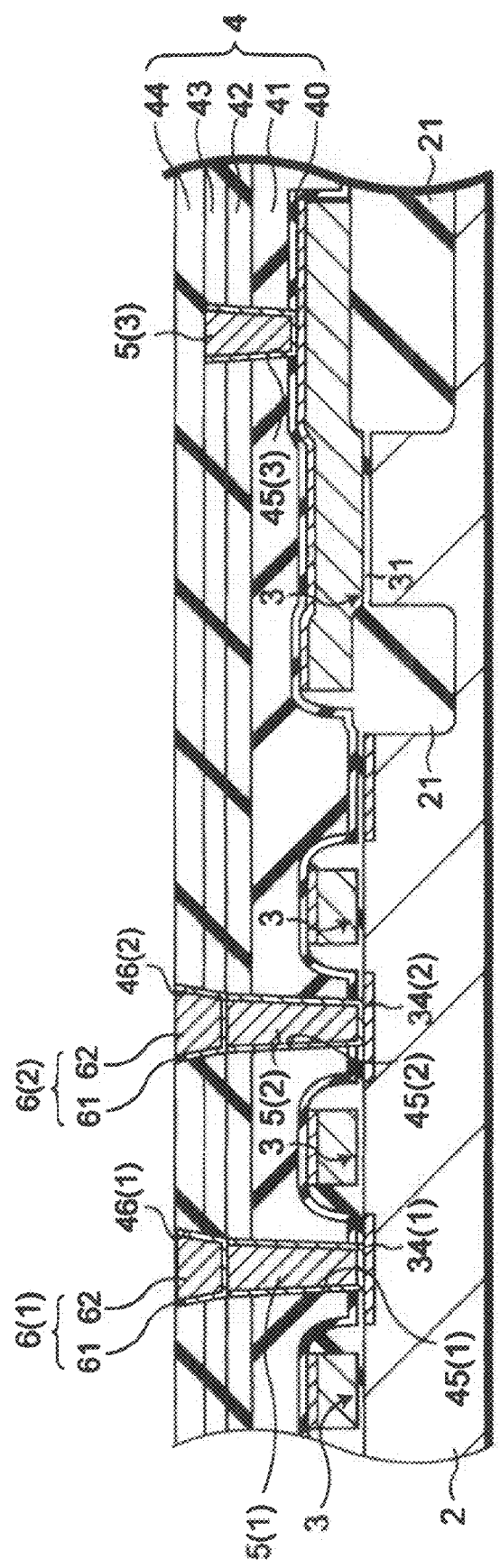
FIG. 7 is a sectional view to describe a fifth process step.

As shown in FIG. 7, a sixth plug 6 (1) is formed in the connection hole 46 (1) and a seventh plug 6 (2) is formed in the connection hole 46 (2). Each of the sixth plug 6 (1) and the seventh plug 6 (2) is formed of a barrier metal layer 61 and a burying conductor 62 formed on the barrier metal layer 61. The barrier metal layer 61 is formed by a sputtering method or a CVD method, for example, and the burying conductor 62 is formed by the CVD method, for example. Excessive barrier film 61 and burying conductor 62 are removed using the CMP method. The height of the top face of each of the sixth plug 6 (1) and the seventh plug 6 (2) from the surface of the substrate 2 is reduced by the film thickness of the insulating film 44 relative to the height of the top face of the third plug 5 (3) from the surface of the substrate 2.

Figure 8:
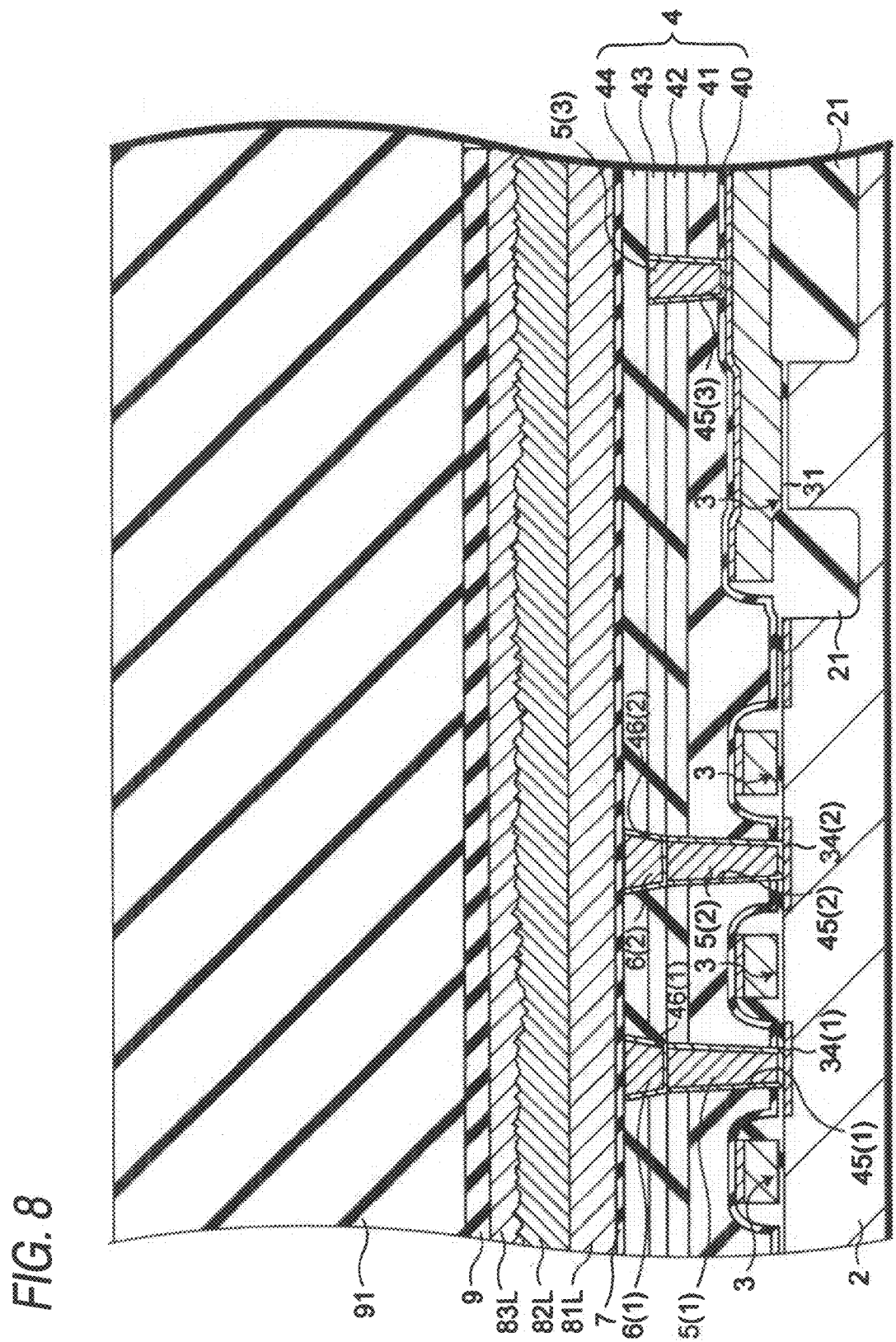
FIG. 8 is a sectional view to describe a sixth process step.

Next, to manufacture ferroelectric capacitors 8, a barrier film 7, a first electrode film 81L, a ferroelectric film 82L, a second electrode film 83L, a barrier film 9 and a mask 91 are deposited in order in all area on the interlayer insulating film 4 (insulating film 44) containing at least the sixth plugs 6 (1), as shown in FIG. 8. For example, a TiAlN film formed by the sputtering method can be used as the barrier film 7. For example, an Ir film formed by the sputtering method can be used as the first electrode film 81L. For example, a PZT film or an SBT film formed by the sputtering method, an MOCVD method, a sol-gel method, or the like can be used as the ferroelectric film 82L. For example, an $IrO_2$ film formed by the sputtering method can be used as the second electrode film 83L. For example, an $Al_2O_3$ film formed by the sputtering method can be used as the barrier film 9. A TEOS film formed by the plasma CVD method can be used as the mask 91.

Figure 9:
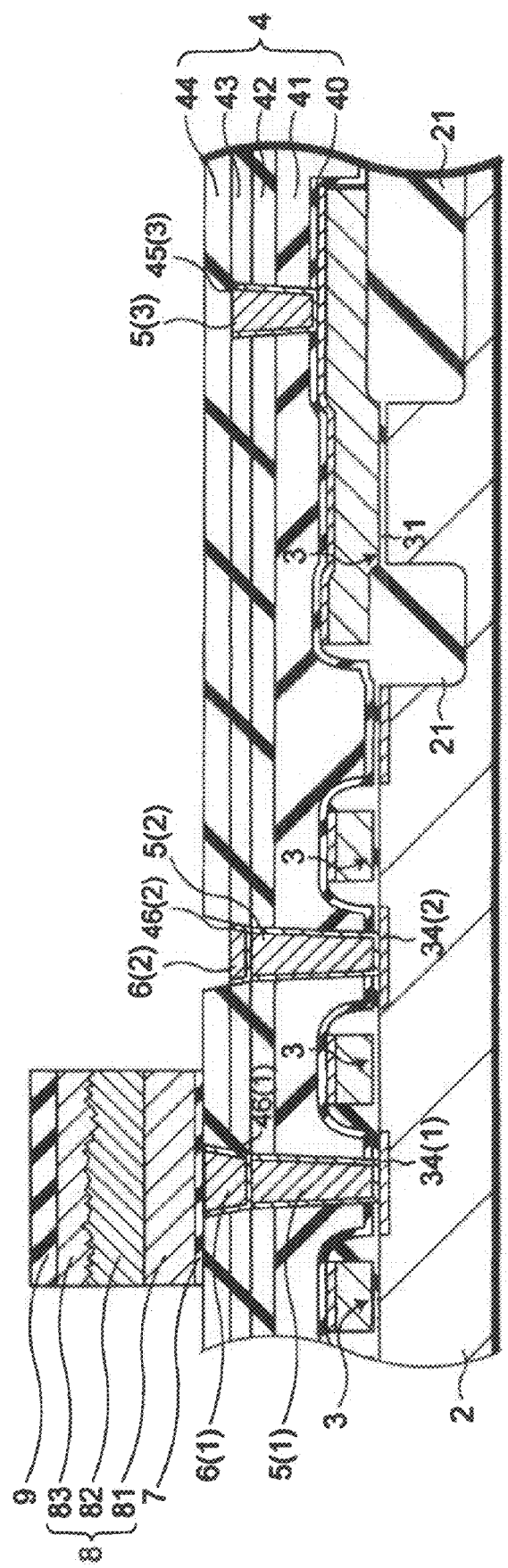
FIG. 9 is a sectional view to describe a seventh process step.

The mask 91 is patterned using the photolithography technique and the etching technique, whereby the mask 91 for patterning the ferroelectric capacitors 8 is formed. The mask 91 exists in the formation regions of the ferroelectric capacitors 8 and does not exist in any other region. The mask 91 is used to pattern the barrier film 9, the second electrode film 83L, the ferroelectric film 82L, the first electrode film 81L, and the barrier film 7, in top-to-bottom order (see FIG. 9). Then, the mask 91 is removed, whereby the ferroelectric capacitor 8 having an electrode 83 patterned from the second electrode film 83L, a ferroelectric 82 patterned from the ferroelectric film 82L, and an electrode 81 patterned from the first electrode film 81L can be completed as shown in FIG. 9. To pattern the mask 91, the barrier film 9, the second electrode film 83L, the ferroelectric film 82L, the first electrode film 81L, and the barrier film 7, for example, anisotropic etching of RIE, etc., can be used. At this time, a part from the top face of the seventh plug 6 (2) exposed from the surface of the insulating film 44 toward the film thickness direction is somewhat removed by overetching at the patterning time of the barrier film 7 as shown in FIG. 9. The top face of the third plug 5 (3) formed on the control electrode 32 is covered with the insulating film 44 and thus is not removed by overetching.

Figure 10:
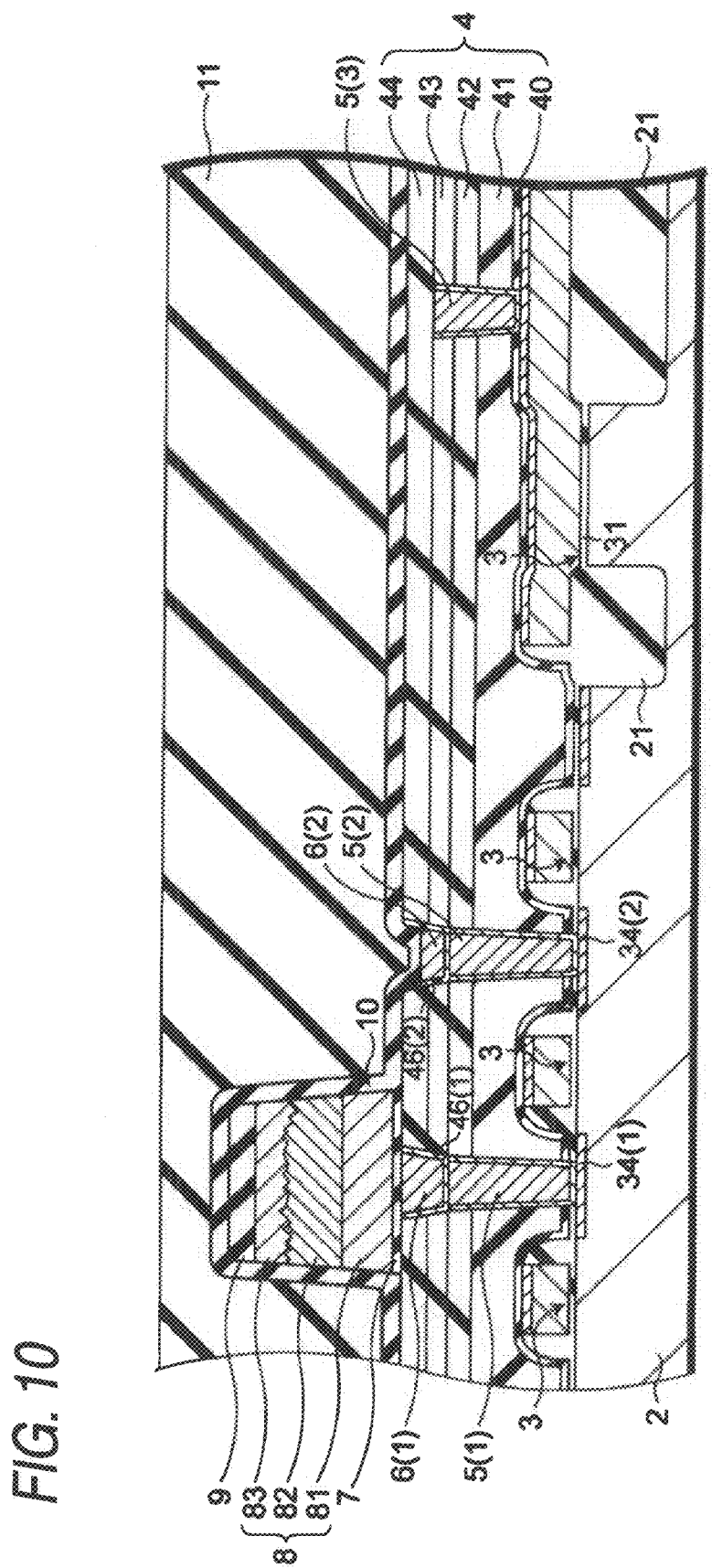
FIG. 10 is a sectional view to describe an eighth process step.

As shown in FIG. 10, a barrier film 10 is formed to cover the ferroelectric capacitor 8 and the interlayer insulating film 4. In the ferroelectric capacitor 8, the sides of the electrode 81, the sides of the ferroelectric film 82, the sides of the electrode 83, the sides of the barrier film 7 and the sides and the top face of the barrier film 9 are covered by the barrier film 10. For example, the barrier film 10 is formed of an $Al_2O_3$ film and is functioning as a hydrogen barrier. For example, the $Al_2O_3$ film is formed by the sputtering method, an atomic layer deposition (ALD) method, or the like. An interlayer insulating film 11 is formed on the barrier film 10 as shown in FIG. 10. For example, a TEOS film formed by the plasma CVD method can be used as the interlayer insulating film 11 and the surface of the TEOS film is formed and then is ground and flattened by the CMP method.

Figure 11:
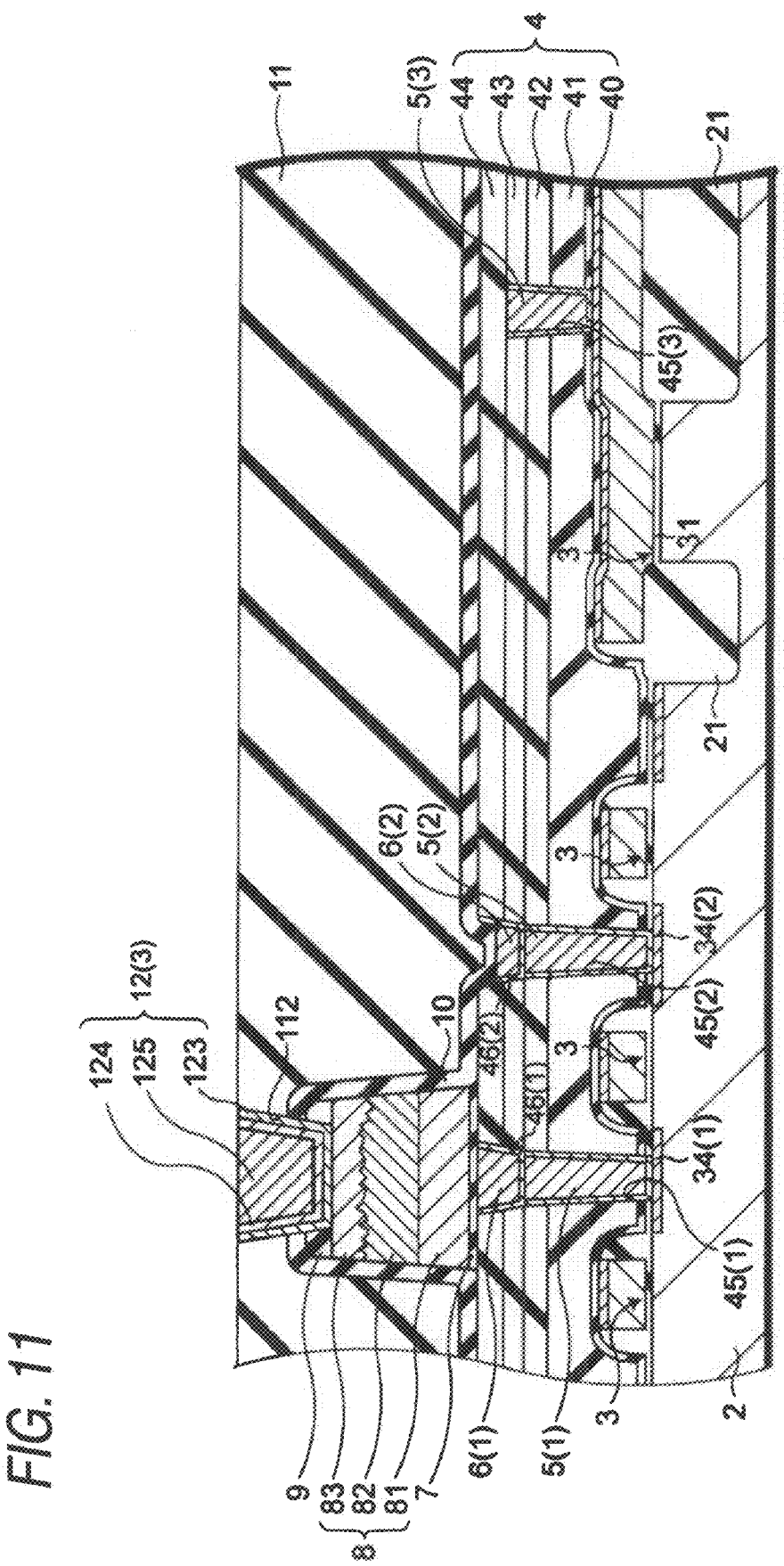
FIG. 11 is a sectional view to describe a ninth process step.

The interlayer insulating film 11 and the barrier films 10 and 9 are partially removed on the electrode 83 of each ferroelectric capacitor 8 to form a connection hole 112 (see FIG. 11). The connection hole 112 can be formed by forming a mask by the photolithography technique and executing anisotropic etching of RIE, etc., for the interlayer insulating film 11, etc., using the mask. An eighth plug 12 (3) is formed in the connection hole 112 as shown in FIG. 11. The eighth plug 12 (3) includes a barrier metal layer 123, an intermediate film 124 and a burying conductor 125. For example, a TiN film formed by the sputtering method can be used as the barrier metal layer 123. For example, an NbN film formed by the sputtering method can be used as the intermediate film 124. For example, an Al film formed by a reflow sputtering method can be used as the burying conductor 125. Excessive barrier film 123, intermediate film 124 and burying conductor 125 are ground by the CMP method and the eighth plug 12 (3) is buried in the connection hole 112.

Figure 12:
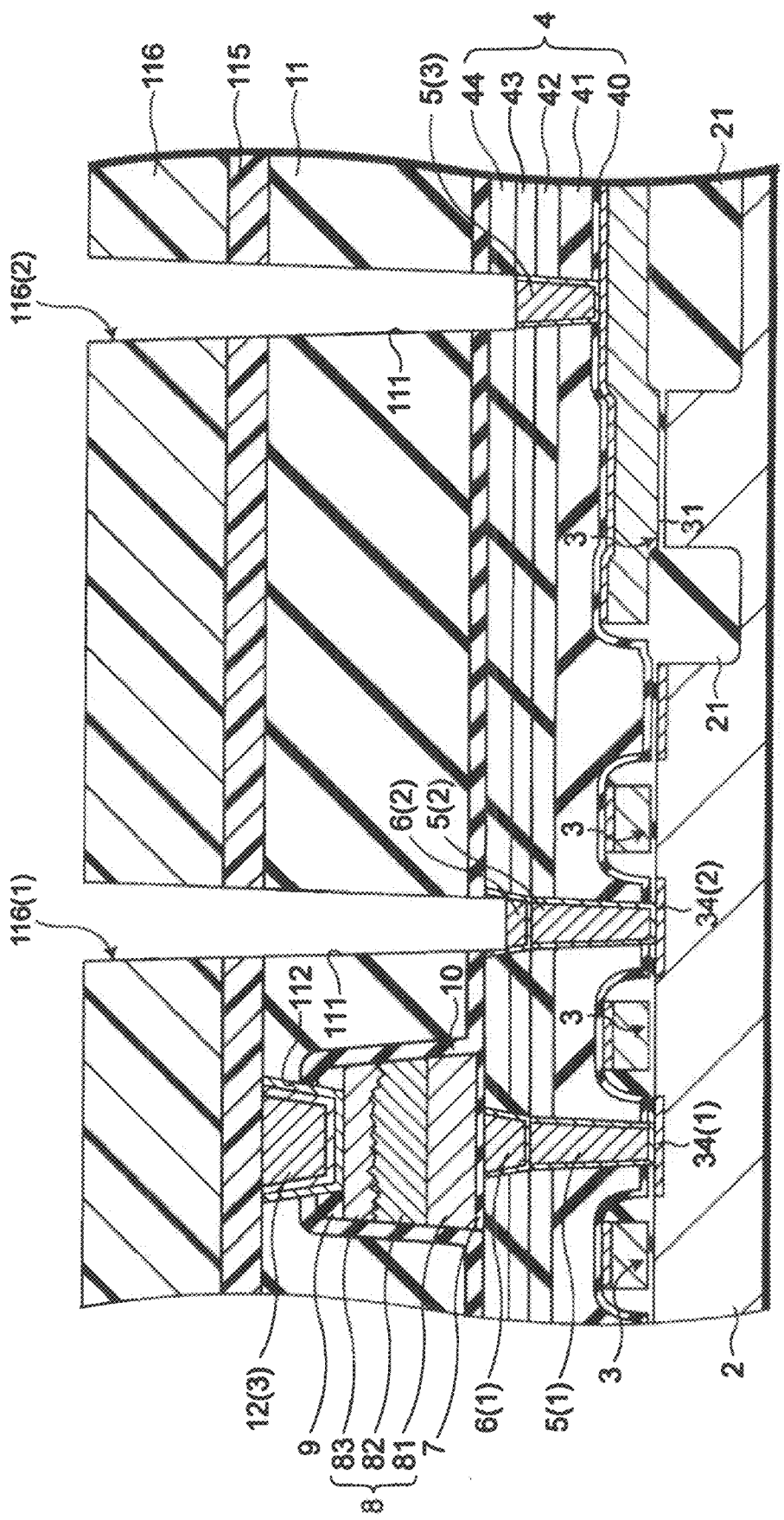
FIG. 12 is a sectional view to describe a tenth process step.

A reflection prevention film (organic arc) 115 and a mask 116 are deposited in order on the interlayer insulating film 11 (see FIG. 12). The mask 116 is formed with an opening 116 (1) above the second plug 5 (2) and on the seventh plug 6 (2) and is formed with an opening 116 (2) on the third plug 5 (3). A photoresist film is used as the mask 116. Using the mask 116, portions of the reflection prevention film 115 exposed from the openings 116 (1) and 116 (2) are removed, and further the interlayer insulating film 11 is etched to form a connection hole 111 therein as shown in FIG. 12. To form the connection hole 111, the barrier film 10 below the interlayer insulating film 11 is used as an etching stopper layer. RIE using a CF-based gas can be used as the etching.

Figure 13:
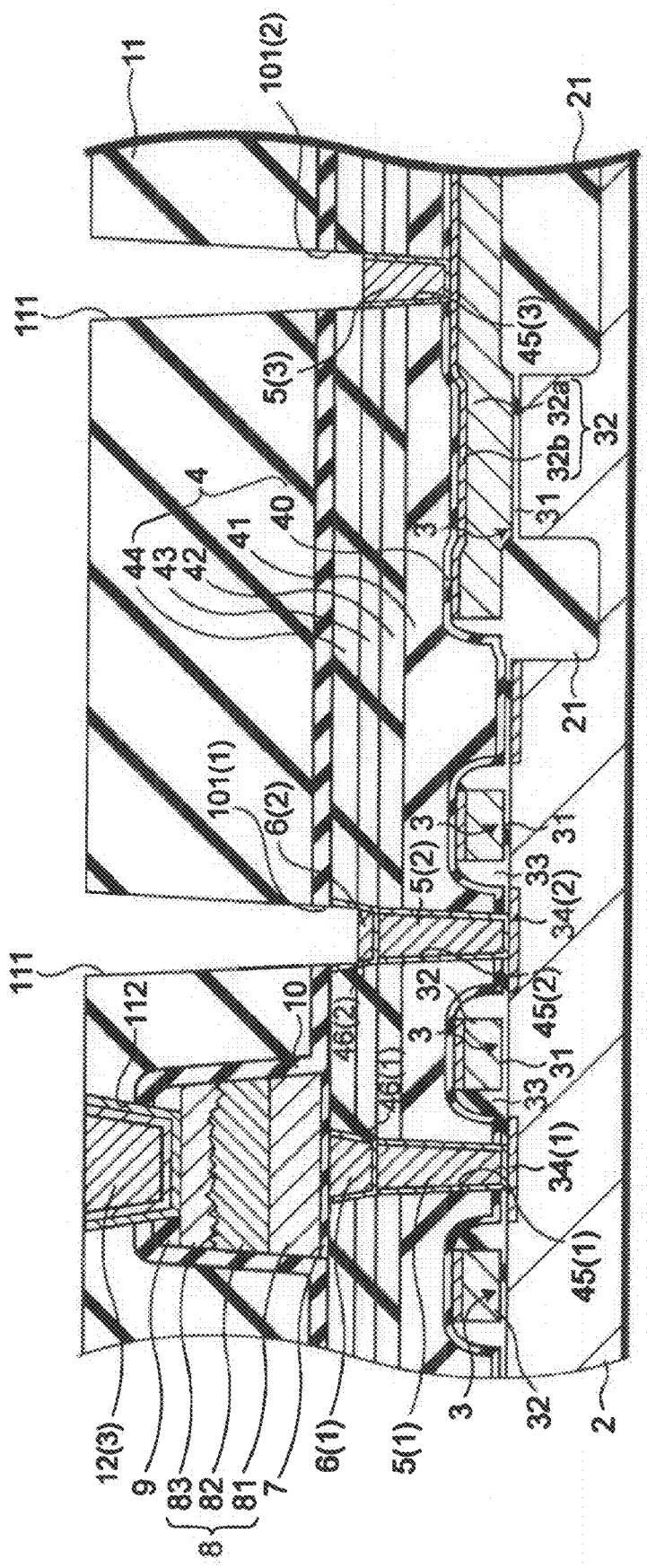
FIG. 13 is a sectional view to describe an eleventh process step.

As shown in FIG. 13, subsequently the barrier film 10 exposed from the connection hole 111 on the seventh plug 6 (2) is selectively removed to form a first connection hole 101 (1), and the barrier film 10 exposed from the connection hole 111 on the third plug 5 (3) is selectively removed to form a second connection hole 101 (2). To form the first connection hole 101 (1) and the second connection hole 101 (2), for example, RIE using a Cl-based gas can be used. Upon completion of the step, the top face of the seventh plug 6 (2) can be exposed completely in the connection hole 111 and the first connection hole 101 (1). Likewise, the top face of the third plug 5 (3) can be exposed completely in the connection hole 111 and the second connection hole 101 (2).

The third plug 5 (3) buried in the connection hole 45 (3) formed in the insulating films 40, 41, 42 and 43 and having the height of the top face high as compared with the height of the top face of each of the first plug 5 (1) and the second plug 5 (2) is disposed on the control electrode 32 of the transistor 3. This means that the aspect ratio can be reduced while the whole plug height (length) is enlarged between the control electrode 32 and the barrier film 10. Therefore, to form the second connection hole 101 (2), unnecessary removal of the interlayer insulating film 4, namely, penetration does not occur.

Subsequently, a fourth plug 12 (1) is buried in the first connection hole 101 (1) of the barrier 10 and the connection hole 111 communicating therewith, and a fifth plug 12 (2) is buried in the second connection hole 101 (2) and the connection hole 111 communicating therewith (see FIG. 14). Each of the fourth plug 12 (1) and the fifth plug 12 (2) has a barrier film 121 and a burying conductor 122 deposited on the barrier film 121.

Figure 14:
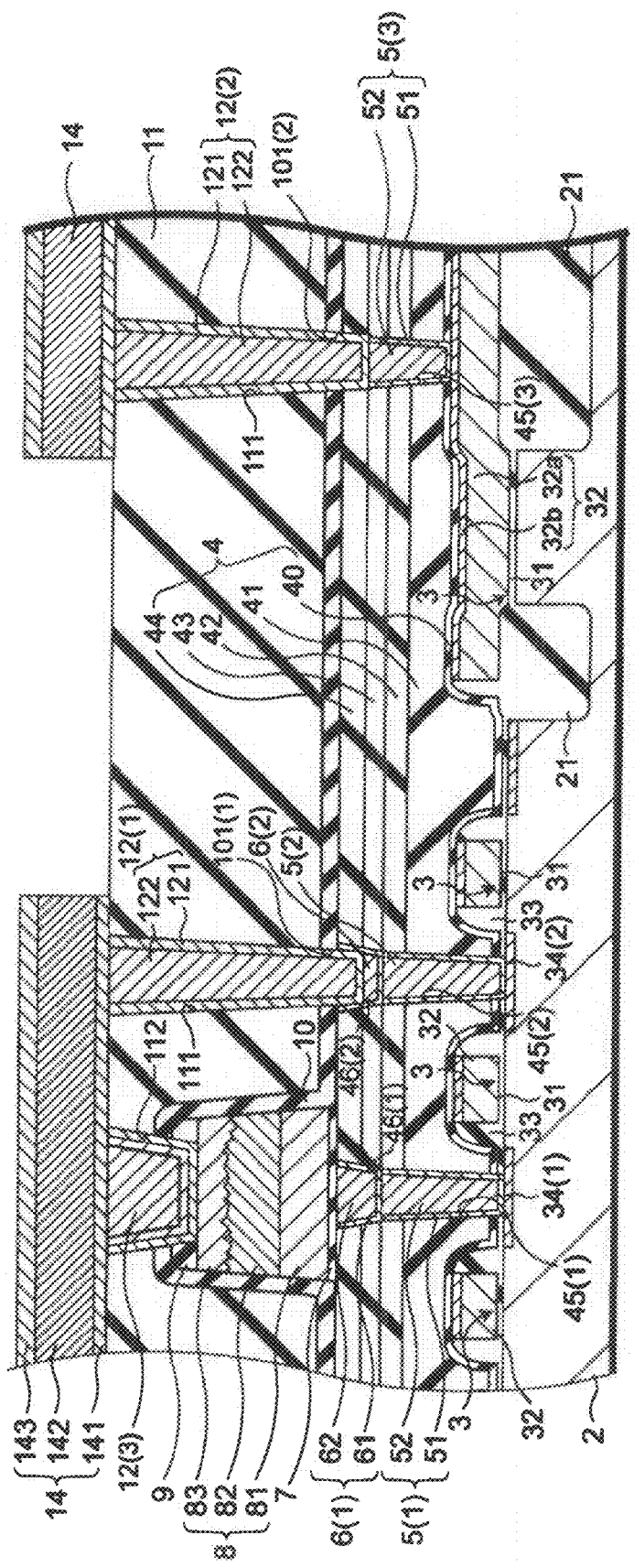
FIG. 14 is a sectional view to describe a twelfth process step.

As shown in FIG. 14, wiring 14 electrically connected to the eighth plug 12 (3) and the fourth plug 12 (1) and wiring 14 electrically connected to the fifth plug 12 (2) are formed on the interlayer insulating film 11. The wiring 14 is formed by forming a barrier metal layer 141, a wiring main body 142 and a barrier metal film 143 in order and then patterning, as described above.

Subsequently, an interlayer insulating film 15 is formed in all area of the principal surface of the substrate 2 containing the wiring 14 (see FIG. 1). In the interlayer insulating film 15, a connection hole 151 is formed on the wiring 14. Next, a ninth plug 16 is buried in the connection hole 151. Wiring 17 electrically connected to the ninth plug 16 is formed on the interlayer insulating film 15 as shown in FIG. 1. The wiring 17 is formed by forming a barrier metal layer 171, a wiring main body 172 and a barrier metal film 173 in order and then patterning, as described above.

Subsequently, an interlayer insulating film 18 is formed in all area of the principal surface of the substrate 2 containing the wiring 17 (see FIG. 1). In the interlayer insulating film 18, a connection hole 181 is formed on the wiring 17. Next, a tenth plug 19 is buried in the connection hole 181. Wiring 20 electrically connected to the tenth plug 19 is formed on the interlayer insulating film 18 as shown in FIG. 1. The wiring 20 is formed by forming a barrier metal layer 201 and a wiring main body 202 in order and then patterning, as described above. When the manufacturing process terminates, then the ferroelectric random access memory 1 according to the first embodiment can be completed.

Modified Example

Figure 15:
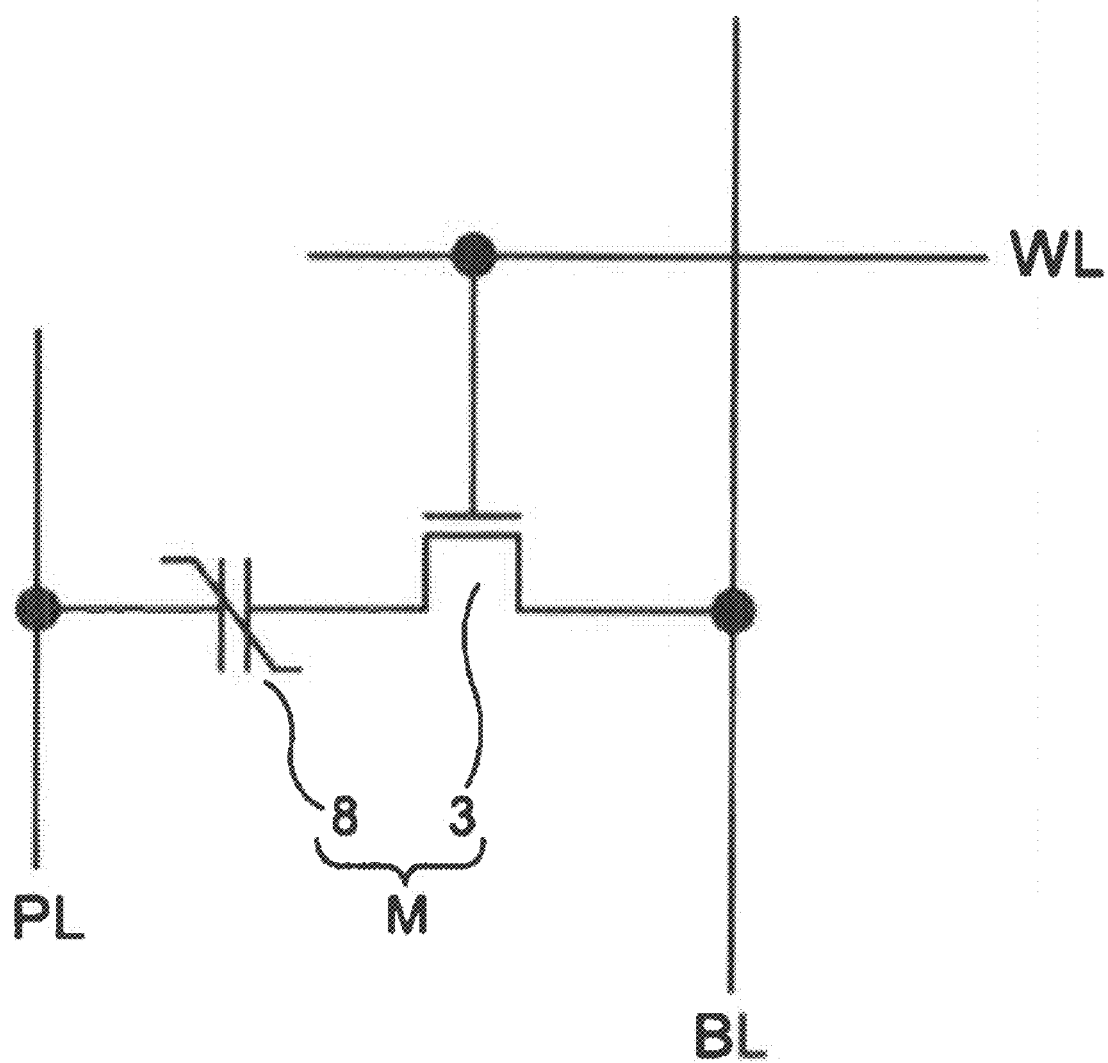
FIG. 15 is a circuit diagram to show another circuit configuration of the ferroelectric random access memory according to the first embodiment.

In the description of the ferroelectric random access memory 1 according to the first embodiment, the Chain-FeRAM™ structure is adopted by way of example, but the invention is not limited to the Chain-FeRAM™ structure and can also be applied to another FeRAM structure. In ferroelectric random access memory 1 according to the modified example of the first embodiment, a memory cell M for storing one-bit information is placed in a crossing point of a bit line BL and a plate line PL and a word line WL as shown in FIG. 15. The memory cell M is implemented as a series circuit made up of a transistor 3 and a ferroelectric capacitor 8. FIG. 15 shows only one 1-bit memory cell M; in fact, however, a plurality of memory cells M are arranged like a matrix along the extension direction of the bit line BL and the extension direction of the word line WL.

As described above, in the ferroelectric random access memory 1 according to the first embodiment, the third plug 5 (3) having the top face higher than that of the second plug 5 (2) is included between the control electrode 32 of the transistor 3 and the barrier film 10 and the plug height of the third plug 5 (3) can be made high (the plug length can be made long) to provide a distance, so that penetration to the control electrode 32 when the second connection hole 101 (2) is formed in the barrier film 10 can be prevented. On the other hand, the first plug 5 (1) and the sixth plug 6 (1) on the first main electrode 34 (1) of the transistor 3 and the second plug 5 (2) and the seventh plug 6 (2) on the second main electrode 34 (2) of the transistor 3 are divided in the vertical direction and each plug length is decreased, so that the aspect ratio can be reduced and the step coverage of the barrier metal films 51 and 61 can be improved. Therefore, a contact connection failure on the first main electrode 34 (1) and the second main electrode 34 (2) of the transistor 3 and a contact connection failure on the control electrode 32 can be prevented. The plug between the control electrode 32 of the transistor 3 and the barrier film 10 is made a single-layer structure of the third plug 5 (3), whereby the number of manufacturing process steps can be decreased. As the number of manufacturing process steps is decreased, the manufacturing cost can be reduced and the manufacturing yield can be improved.

Second Embodiment

In a second embodiment, the plug structure on the main electrode 34 of the transistor 3 is changed from the ferroelectric random access memory 1 according to the first embodiment described above.

Figure 16:
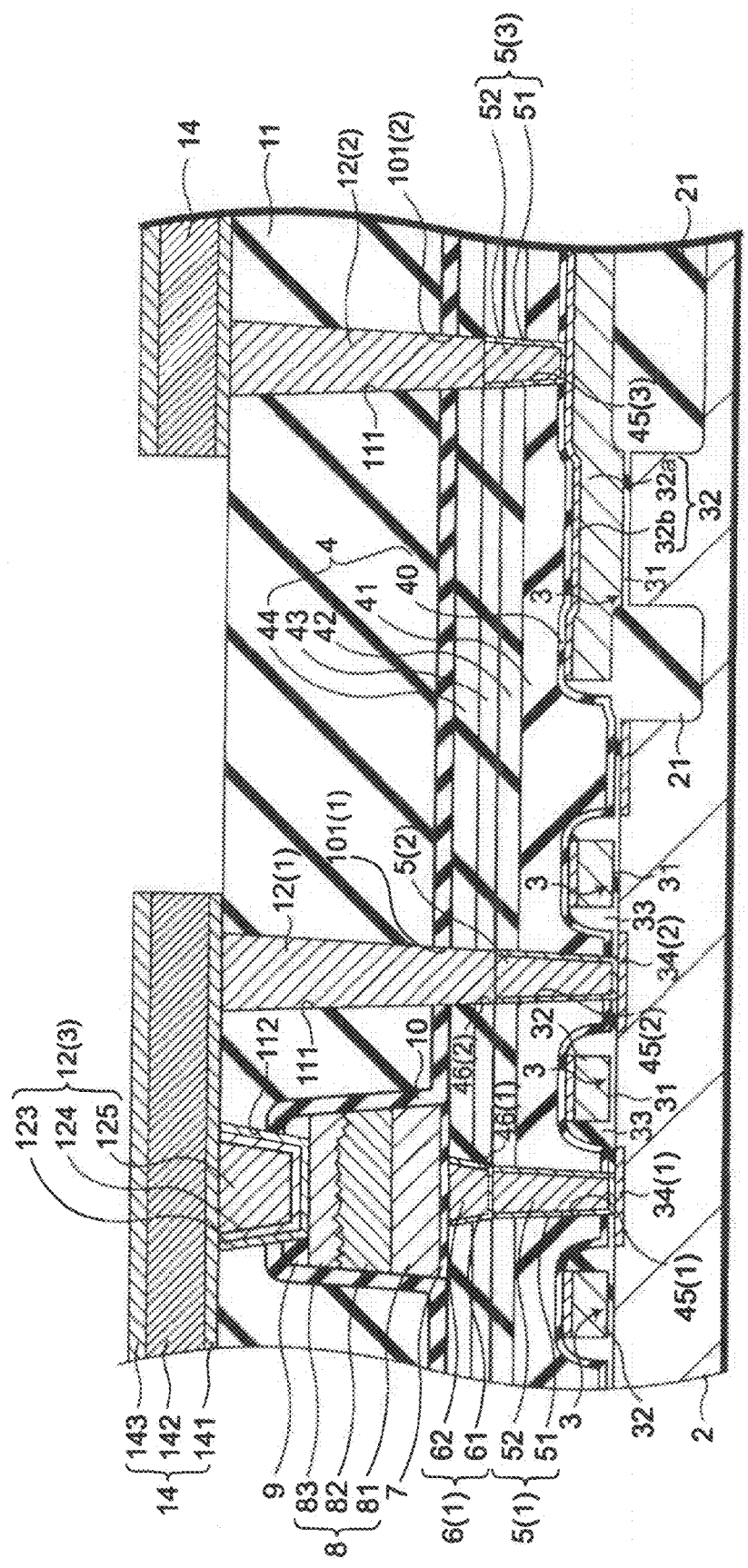
FIG. 16 is a cross-sectional structure drawing of ferroelectric random access memory according to a second embodiment.

As shown in FIG. 16, ferroelectric random access memory 1 according to the second embodiment basically has the same structure as the ferroelectric random access memory 1 according to the first embodiment except that it does not include the seventh plug 6 (2) on the second plug 5 (2) on the second main electrode 34 (2) of the transistor 3 (see FIG. 1). That is, in the second embodiment, a fourth plug 12 (1) is directly and electrically connected to the top face of a second plug 5 (2) through a connection hole 111 and a first connection hole 101 (1). In the second embodiment, the fourth plug 12 (1) and a fifth plug 12 (2) are formed of a W film. A sixth plug 6 (1) is disposed on a first main electrode 34 (1). A third plug 5 (3) on a control electrode 32 has the same structure as the third plug 5 (3) of the ferroelectric random access memory 1 according to the first embodiment described above. That is, the height of the top face of the third plug 5 (3) is set higher than the height of the top face of the second plug 5 (2). A fourth plug 12 (1) disposed on the second main electrode 34 (2) of the transistor 3 is connected to the second plug 5 (2) through the connection hole 111 disposed in an interlayer insulating film 11, the first connection hole 101 (1) disposed in a barrier film 10, and a connection hole 46 (2) disposed in insulating films 44 and 43.

In a method for manufacturing the ferroelectric random access memory 1, a second plug 5 (2) on a second main electrode 34 (2) is formed in the same manufacturing step of forming a first plug 5 (1) on a first main electrode 34 (1). Then, a sixth plug 6 (1), a ferroelectric capacitor 8, a barrier film 10 and an interlayer insulating film 11 are formed on the first main electrode 34 (1) and then a connection hole 111 is formed in the interlayer insulating film 11 and a connection hole 46 (2) is formed in insulating films 44 and 43. The connection hole 46 (2) is formed in the same manufacturing step as the step of forming a connection hole (with no reference numeral) disposed in the insulating film 44 on the third plug 5 (3) disposed on the control electrode 32.

Wiring 14 is connected to an eighth plug 12 (3) and a fourth plug 12 (1) connected to an electrode 83 of the ferroelectric capacitor 8 and likewise wiring 14 is connected to a fifth plug 12 (2). FIG. 16 shows only apart of the structure to the wiring 14, but the upper layers of the wiring 14 are of the same structure as the upper layers of the wiring 14 of the ferroelectric random access memory 1 previously described with reference to FIG. 1.

As described above, the ferroelectric random access memory 1 according to the second embodiment can provide similar advantages to those of the ferroelectric random access memory 1 according to the first embodiment. The ferroelectric random access memory 1 according to the second embodiment does not include the seventh plug 6 (2) shown in FIG. 1 on the second plug 5 (2) on the second main electrode 34 (2) of the transistor 3. Consequently, during patterning the ferroelectric capacitor 8 and a barrier film 7 as shown in FIG. 9, the overetching on the seventh plug 6 (2) exposed from the surface of the insulating film 44 can be prevented, and a contract shape failure occurring therein can be prevented.

Although each of the fourth plug 12 (1) and the fifth plug 12 (2) includes the barrier metal layer 121 and the burying conductor 122, that are abbreviated from FIG. 16.

Third Embodiment

In a third embodiment, the plug structure on the main electrode 34 of the transistor 3 is changed from the first embodiment similarly to the second embodiment, and the structure of an interlayer insulating film other than the region around a ferroelectric capacitor 8 is also changed.

Figure 17:
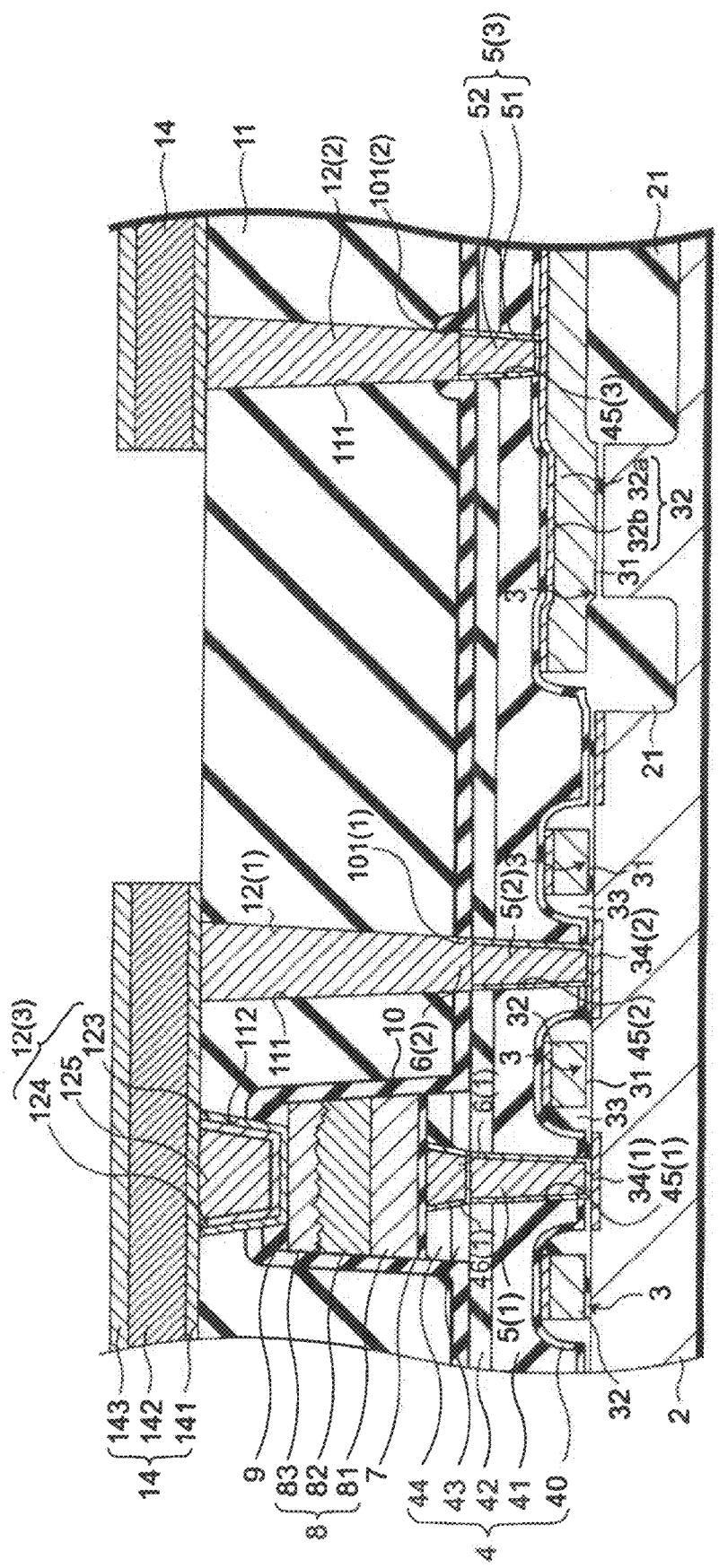
FIG. 17 is a cross-sectional structure drawing of ferroelectric random access memory according to a third embodiment.

As shown in FIG. 17, ferroelectric random access memory 1 according to the third embodiment basically has the same structure as the ferroelectric random access memory 1 according to the second embodiment except that it includes insulating films 43 and 44 in the region of the ferroelectric capacitor 8 and does not include the insulating film 43 or 44 in any other region. This means that the insulating films 43 and 44 of the upper layers are patterned in accordance with the shape of the ferroelectric capacitor 8 of the transistor 3 and do not exist between a second plug 5 (2) on a second main electrode 34 (2) and a barrier film 10 and do not exist between a third plug 5 (3) on a control electrode 32 and the barrier film 10. The barrier film 10 is disposed directly on the surface of the insulating film 42 in regions other than the ferroelectric capacitor 8.

In a method for manufacturing the ferroelectric random access memory 1, a second plug 5 (2) on a second main electrode 34 (2) is formed in the same manufacturing step of forming a first plug 5 (1) on a first main electrode 34 (1). Then, a sixth plug 6 (1) and a ferroelectric capacitor 8 are formed on the first main electrode 34 (1). Insulating films 44 and 43 are patterned with the ferroelectric capacitor 8 as an etching mask. Then, an interlayer insulating film 11 is formed, and a connection hole 111 is formed therein. At this time, a barrier film 10 is functioning as an etching stopper layer when forming the connection hole 111. A portion of the barrier film 10 exposed from the connection hole 111 is etched to form a first connection hole 101 (1) and a second connection hole 101 (2).

The etching amount required to form the first connection hole 101 (1) and the second connection hole 101 (2) is determined only by the film thickness of the barrier film 10. Therefore, the etching depth can be set accurately, and no overetching will occur. When the first connection hole 101 (1) is formed, the surface of the second plug 5 (2) below the first connection hole 101 (1) is exposed and when the second connection hole 101 (2) is formed, the surface of a third plug 5 (3) below the second connection hole 101 (2) is exposed. A fourth plug 12 (1) is buried in the first connection hole 101 (1) and the connection hole 111 communicating therewith, and a fifth plug 12 (2) is buried in the second connection hole 101 (2) and the connection hole 111 communicating therewith.

Wiring 14 is connected to an eighth plug 12 (3) and the fourth plug 12 (1) connected to an electrode 83 of the ferroelectric capacitor 8 and likewise wiring 14 is connected to the fifth plug 12 (2). FIG. 17 shows only a part of the structure to the wiring 14, but the upper layers of the wiring 14 are of the same structure as the upper layers of the wiring 14 of the ferroelectric random access memory 1 previously described with reference to FIG. 1.

As described above, the ferroelectric random access memory 1 according to the third embodiment can provide similar advantages to those of the ferroelectric random access memory 1 according to the first embodiment. Further, the insulating films 43 and 44 are not disposed between the top face of the second plug 5 (2) on the second main electrode 34 (2) of the transistor 3 and the barrier film 10 and are not disposed between the top face of the third plug 5 (3) on a control electrode 32 and the barrier film 10, and the barrier film 10 is disposed directly on the top face of the second plug 5 (2) and the top face of the third plug 5 (3). Consequently, the etching amount of the first connection hole 101 (1) formed in the barrier film 10 on the second plug 5 (2) and the etching amount of the second connection hole 101 (2) formed in the barrier film 10 on the third plug 5 (3) are determined by the film thickness of the barrier film 10, so that overetching more than necessary can be prevented and a contact shape failure can be prevented.

Although each of the fourth plug 12 (1) and the fifth plug 12 (2) includes the barrier metal layer 121 and the burying conductor 122, that are abbreviated from FIG. 17.

Fourth Embodiment

Configuration of Ferroelectric Random Access Memory

Figure 18:
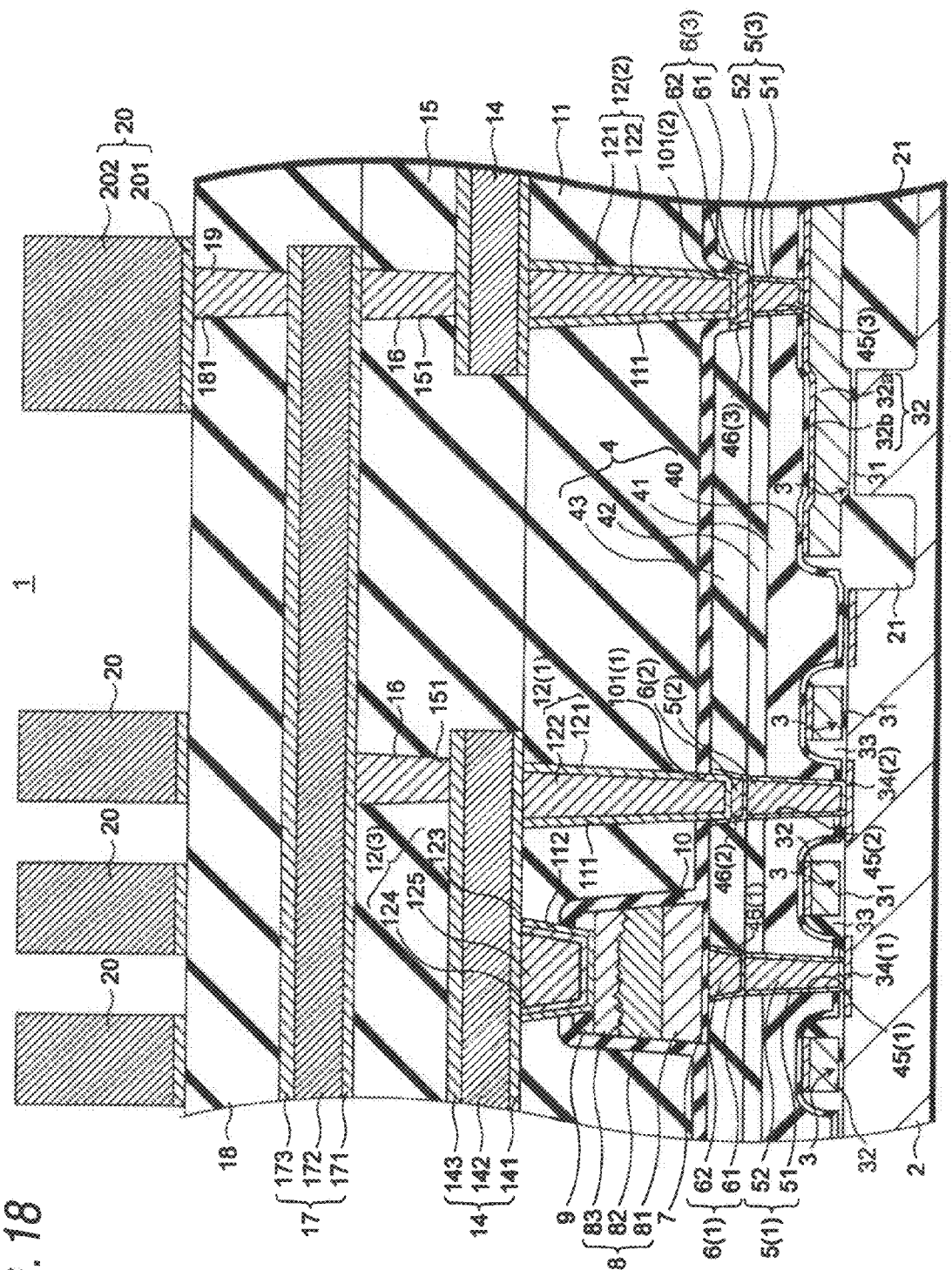
FIG. 18 is a cross-sectional structure drawing of ferroelectric random access memory according to a fourth embodiment.

As shown in FIG. 18, the ferroelectric random access memory 1 according to the fourth embodiment has a substrate 2 as a main body. The ferroelectric random access memory 1 includes a plurality of transistors 3 each having a first main electrode 34 (1), a second main electrode 34 (2) and a control electrode 32, first plugs 5 (1) each disposed on the first main electrode 34 (1) of the transistor 3 and electrically connected to the first main electrode 34 (1), second plugs 5 (2) each disposed on the second main electrode 34 (2) and electrically connected to the second main electrode 34 (2), third plugs 5 (3) each disposed on the control electrode 32 and electrically connected to the control electrode 32, ferroelectric capacitors 8 each disposed on the first plug 5 (1) and having one electrode 81 electrically connected to the first plug 5 (1), a barrier film 10 covering the surfaces of the ferroelectric capacitors 8 and the tops of the transistors 3 containing the tops of the second plugs 5 (2) and the third plugs 5 (3) for preventing entry of substance having an effect on the crystalline composition of a ferroelectric 82 of the ferroelectric capacitor 8, eleventh plugs 6 (3) each electrically connected to the third plug 5 (3) between the third plug 5 (3) and the barrier film 10, fourth plugs 12 (1) each disposed on the second plug 5 (2) and electrically connected to the second plug 5 (2) through a connection hole (first connection hole) 101 (1) disposed in the barrier film 10, and fifth plugs 12 (2) each disposed on the eleventh plug 6 (3) and electrically connected to the eleventh plug 6 (3) through a connection hole (second connection hole) 101 (2) disposed in the barrier film 10.

The ferroelectric random access memory 1 further includes sixth plugs 6 (1) each electrically connected to both the first plug 5 (1) and the one electrode 81 of the ferroelectric capacitor 8 therebetween and seventh plugs 6 (2) each electrically connected at one end to the second plug 5 (2) and electrically connected at the other end to the fourth plug 12 (1) through the connection hole 101 (1) between the second plug 5 (2) and the barrier film 10.

In the fourth embodiment, a semiconductor substrate, such as a p-type silicon monocrystalline substrate is used as the substrate 2. An n-type silicon monocrystalline substrate having p-type well regions (or p-type silicon monocrystalline substrate) may be used as the substrate 2. Element isolation regions 21 are disposed in inactive regions of the principal surface of the substrate 2. Each element isolation region 21 is implemented as a silicon oxide film provided by selectively oxidizing the principal surface of the substrate 2, for example. The element isolation region 21 can adopt a shallow trench isolation (STI) structure. The element isolation region 21 adopting the STI structure includes a trench disposed from the principal surface of the substrate 2 toward the depth direction thereof and an insulator buried in the trench.

The transistor 3 is disposed in an active region of the principal surface of the substrate 2 in the region surrounded by the element isolation region 21. That is, the transistor 3 includes the substrate 2 used as a channel formation region, a gate insulating film 31 on the channel formation region (the principal surface of the substrate 2), the control electrode (gate electrode) 32 on the gate insulating film 31, and the first main electrode 34 (1) and the second main electrode 34 (2) disposed separately on the principal surface of the substrate 2 on both sides of the control electrode 32.

In the fourth embodiment, a single-layer film such as a silicon oxide film, a silicon nitride film, or an oxynitride film or a composite film with at least two or more of these films deposited can be used as the gate insulating film 31. A composite film having a silicon polycrystalline film 32a and a high melting point metal silicide film 32b deposited on the film 32a, for example, can be used as the control electrode 32. Each of the first main electrode 34 (1) and the second main electrode 34 (2) has a silicon monocrystalline semiconductor region or at least a surface portion thereof implemented as a high melting point metal silicide film. To adopt a salicide structure, the high melting point metal silicide film 32b of the control electrode 32 and at least the surface portions of the first main electrode 34 (1) and the second main electrode 34 (2) are formed of the same material. In the fourth embodiment, for example, a cobalt silicide (CoSi) film can be used as the high melting point metal silicide film. A side wall spacer 33 is disposed on a side wall face of the control electrode 32. When the salicide structure is formed, the side wall spacer 33 prevents a short circuit between each of the first main electrode 34 (1) and the second main electrode 34 (2) and the control electrode 32.

The ferroelectric capacitor 8 includes one electrode (or first electrode or bottom electrode) 81, the ferroelectric 82 deposited on the electrode 81 and the other electrode (or second electrode or top electrode) 83 deposited on the ferroelectric 82. The electrode 81 is formed of an iridium (Ir) film, for example. For example, any of a platinum (pt) film, an iridium oxide ($IrO_2$) film, or a strontium ruthenium oxide (SRO) film can be used as the electrode 81. For example, a ferroelectric material of a lead-zirconate-titanate (PZT, for example, Pb(Zr, Ti)$O_3$) film, a bismuth strontium tantalite (STB, for example, $SrBi_2Ta_2O_9$) film, etc., can be used as the ferroelectric 82. The electrode 83 is formed of an $IrO_2$ film, for example. For example, any of a Pt film, an Ir film, or an SRO film can be used as the electrode 83.

The ferroelectric capacitor 8 is disposed on a barrier film (first barrier film or reaction prevention film) 7. More particularly, the bottom electrode 81 of the ferroelectric capacitor 8 is disposed directly on the surface of the barrier film 7. The barrier film 7 has electric conductivity and shuts off oxygen entering the ferroelectric 82 from beneath through the bottom electrode 81. Oxygen causes an effect on the crystalline composition of the ferroelectric 82. For example, a titanium aluminum nitride (TiAlN) film can be used as the barrier film 7. A titanium aluminum (TiAl) film, etc., can be also used as the barrier film 7.

A barrier film (second barrier film or reaction prevention film) 9 is disposed on the top electrode 83 of the ferroelectric capacitor 8. The barrier film 9 has electric conductivity and shuts off oxygen entering the ferroelectric 82 from above through the top electrode 83. For example, an aluminum oxide ($Al_2O_3$) film can be used as the barrier film 9.

In all area on the principal surface of the substrate 2 containing the transistors 3, an interlayer insulating film 4 is disposed below the barrier film 7 below the ferroelectric capacitor 8. In the fourth embodiment, the number of layers and the material of the interlayer insulating film 4 are not necessarily limited; the interlayer insulating film 4 is formed of a composite film with insulating films 40, 41, 42 and 43 deposited in order. The insulating film 40 of the lowest layer is formed of a silicon nitride ($Si_3N_4$) film, for example. The insulating film 41 is disposed on the insulating film 40; for example, a silicon oxide ($SiO_2$) film, particularly, a boron phosphorus silicate glass (BPSG) film capable of promoting surface flattening can be used. The insulating film 42 is disposed on the insulating film 41; for example, an $SiO_2$ film, particularly, a tetra ethoxy silane (TEOS) film that can be formed at low temperature and has dense film quality can be used. The insulating film 43 is disposed on the insulating film 42; for example, an $SiO_2$ film, particularly, a TEOS film that can be formed at low temperature and has dense film quality can be used.

A barrier film (third barrier film or reaction prevention film) 10 is disposed on the ferroelectric capacitor 8 and on the interlayer insulating film 4 except the region where the ferroelectric capacitor 8 is disposed. The barrier film 10 covers the side surroundings of the ferroelectric capacitor 8, specifically the side surroundings of the electrode 81, the side surroundings of the ferroelectric 82, and the side surroundings of the electrode 83 and covers the side surroundings and the top face of the barrier film 9. The barrier film 10 has insulation properties and shuts off hydrogen entering the ferroelectric 82 from the surroundings thereof. Hydrogen has an effect on the crystalline composition of the ferroelectric 82. In the fourth embodiment, an $Al_2O_3$ film can be used as the barrier film 10.

The first plug 5 (1) is disposed in a connection hole (contact hole or via hole) 45 (1) disposed in the insulating films 40, 41 and 42 on the first main electrode 34 (1) of the transistor 3. The first plug 5 (1) includes a barrier metal layer 51 disposed along the inner wall of the connection hole 45 (1) and the first main electrode 34 (1) exposed from the bottom face thereof and a burying conductor 52 disposed on the barrier metal layer 51 for burying the inside of the connection hole 45 (1). A deposition film having a titanium (Ti) film and a titanium nitride (TiN) film deposited on the Ti film can be used as the barrier metal layer 51. For example, a tungsten (W) film can be used as the burying conductor 52. The sixth plug 6 (1) on the first plug 5 (1) is disposed in a connection hole (through hole or via hole) 46 (1) disposed in the insulating film 43. The sixth plug 6 (1) includes a barrier metal layer 61 disposed along the inner wall of the connection hole 46 (1) and the first plug 5 (1) exposed from the bottom face thereof and a burying conductor 62 disposed on the barrier metal layer 61 for burying the inside of the connection hole 46 (1). The barrier metal layer 61 is formed of the same material as the barrier metal layer 51, for example, and the burying conductor 62 is formed of the same material as the burying conductor 52.

The second plug 5 (2) is disposed in a connection hole 45 (2) disposed in the insulating films 40, 41 and 42 on the second main electrode 34 (2) of the transistor 3. Like the first plug 5 (1), the second plug 5 (2) includes a barrier metal layer 51 disposed along the inner wall of the connection hole 45 (2) and the second main electrode 34 (2) exposed from the bottom face thereof and a burying conductor 52 disposed on the barrier metal layer 51 for burying the inside of the connection hole 45 (2). The seventh plug 6 (2) on the second plug 5 (2) is disposed in a connection hole 46 (2) disposed in the insulating film 43. The seventh plug 6 (2) includes a barrier metal layer 61 disposed along the inner wall of the connection hole 46 (2) and the second plug 5 (2) exposed from the bottom face thereof and a burying conductor 62 disposed on the barrier metal layer 61 for burying the inside of the connection hole 46 (2).

The third plug 5 (3) is disposed in a connection hole 45 (3) disposed in the insulating films 40, 41 and 42 on the control electrode 32 of the transistor 3, more particularly on the high melting point metal silicide film 32b. Like the first plug 5 (1), the third plug 5 (3) includes a barrier metal layer 51 disposed along the inner wall of the connection hole 45 (3) and the high melting point metal silicide film 32b exposed from the bottom face thereof and a burying conductor 52 disposed on the barrier metal layer 51 for burying the inside of the connection hole 45 (3). The eleventh plug 6 (3) on the third plug 5 (3) is disposed in a connection hole 46 (3) disposed in the insulating film 43. The eleventh plug 6 (3) includes a barrier metal layer 61 disposed along the inner wall of the connection hole 46 (3) and the third plug 5 (3) exposed from the bottom face thereof and a burying conductor 62 disposed on the barrier metal layer 61 for burying the inside of the connection hole 46 (3).

The first plug 5 (1), the second plug 5 (2) and the third plug 5 (3) are disposed in the same layer. That is, each of the first plug 5 (1), the second plug 5 (2) and the third plug 5 (3) is disposed in the insulating films 40, 41 and 42. The sixth plug 6 (1) on the first plug 5 (1), the seventh plug 6 (2) on the second plug 5 (2) and the eleventh plug 6 (3) on the third plug 5 (3) are disposed in the same layer.

A portion of the control electrode 32 on the gate insulating film 31 in an active region is effectively functioning as the control electrode of the transistor 3. At least one end of the control electrode 32 in the gate length direction thereof is extended onto the element isolation region 21 and the extended region is used as a contact region for electrically connecting the third plug 5 (3) above the control electrode 32 to the control electrode 32. On the control electrode 32 of the transistor 3, the third plug 5 (3) and the eleventh plug 6 (3) having a top and bottom two-stage structure are disposed in the interlayer insulating film 4 between the control electrode 32 and the barrier film 10. This means that the third plug 5 (3) and the eleventh plug 6 (3) are stacked vertically on the control electrode 32. In other words, the depth of each of the connection hole 45 (3) in which the third plug 5 (3) is disposed and the connection hole 46 (3) in which the eleventh plug 6 (3) is disposed is made shallow, the aspect ratio of each of the connection holes 45 (3) and 46 (3) is set small, and the third plug 5 (3) disposed in the connection hole 45 (3) and the eleventh plug 6 (3) disposed in the connection hole 46 (3) are stacked. In the fourth embodiment, the aspect ratio of each of the connection holes 45 (3) and 46 (3) is set to 4 or less. In other words, each of the third plug 5 (3) and the eleventh plug 6 (3) is formed to have the height four times or less the bottom dimension.

The bottom face area of the eleventh plug 6 (3) on the control electrode 32 is set larger than the top face area of the third plug 5 (3). The bottom face area of the eleventh plug 6 (3) is set larger than the top face area of the third plug 5 (3) by an alignment allowance dimension. For example, in the fourth embodiment, the bottom face area of the eleventh plug 6 (3) is set larger by at least 40 nm or more as compared with the top face area of the third plug 5 (3).

An interlayer insulating film 11 is disposed on the barrier film 10 in all area of the principal surface of the substrate 2. For example, an $SiO_2$ film, particularly, a TEOS film that can be formed at low temperature and has dense film quality can be used as the interlayer insulating film 11. A connection hole 112 is disposed on the ferroelectric capacitor 8 of the interlayer insulating film 11 and an eighth plug 12 (3) is disposed in the connection hole 112. In the fourth embodiment, the eighth plug 12 (3) includes a barrier metal layer 123 disposed along the side walls of the connection hole 112 and the surface of the electrode 83 of the ferroelectric capacitor 8 exposed from the bottom face thereof, an intermediate film 124 on the barrier metal layer 123 and a burying conductor 125 on the intermediate film 124. For example, a TiN film can be used as the barrier metal layer 123. The intermediate film 124 is used to improve a wettability of the barrier metal layer 123 and the burying conductor 125 and a niobium nitride (NbN) film can be used as the intermediate film 124, for example. Aluminum (Al) can be used as the burying conductor 125, for example. For example, when W is used as the burying conductor 125, the intermediate film (NbN film) 124 may not be required.

In the interlayer insulating film 11, the fourth plug 12 (1) is disposed on the seventh plug 6 (2) on the second plug 5 (2). The fourth plug 12 (1) includes a barrier metal layer 121 disposed on the connection hole 111 in an interlayer insulating film 11, the first connection hole 101 (1) in the barrier film 10 and the seventh plug 6 (2) exposed from the first connection hole 101 (1) and a burying conductor 122 disposed on the barrier metal layer 121. In the interlayer insulating film 11, the fifth plug 12 (2) is disposed on the eleventh plug 6 (3) on the third plug 5 (3). The fifth plug (2) includes a barrier metal layer 121 disposed on the connection hole 111 in the interlayer insulating film 11, the second connection hole 101 (2) in the barrier film 10 and the eleventh plug 6 (3) exposed from the second connection hole 101 (2) and a burying conductor 122 disposed on the barrier metal layer 121. For example, a deposition film having a Ti film and a TiN film deposited on the Ti film can be used as the barrier metal layer 121. For example, a W film can be used as the burying conductor 122.

On the interlayer insulating film 11, wirings (first layer metal wirings) 14 electrically connected to the fourth plug 12 (1), the fifth plug 12 (2) and the eighth plug 12 (3) disposed in the interlayer insulating film 11 are disposed. In the fourth embodiment, the wiring 14 includes a barrier metal film 141, a wiring main body 142 on the barrier metal film 141 and a barrier metal film 143 on the wiring main body 142. For example, a deposition film having a Ti film and a TiN film deposited on the Ti film can be used as the barrier metal layer 141. For example, an Al film or an Al alloy film can be used as the wiring main body 142. For example, a deposition film having a Ti film and a TiN film deposited on the Ti film can be used as the barrier metal film 143 like the barrier metal layer 141.

An interlayer insulating film 15 is disposed in all area of the principal surface of the substrate 2 containing the wiring 14. For example, an SiO$_2$ film, particularly, a TEOS film that can be formed at low temperature and has dense film quality can be used as the interlayer insulating film 15. A ninth plug 16 buried in a connection hole 151 formed in the interlayer insulating film 15 is disposed on the wiring 14 in the interlayer insulating film 15. For example, a W film can be used as the ninth plug 16.

Wiring (second layer metal wiring) 17 electrically connected to the ninth plug 16 is disposed on the interlayer insulating film 15. In the fourth embodiment, the wiring 17 includes a barrier metal film 171, a wiring main body 172 on the barrier metal film 171 and a barrier metal film 173 on the wiring main body 172. For example, a deposition film having a Ti film and a TiN film deposited on the Ti film can be used as the barrier metal layer 171. For example, an Al film or an Al alloy film can be used as the wiring main body 172. For example, a deposition film having a Ti film and a TiN film deposited on the Ti film can be used as the barrier metal film 173 like the barrier metal layer 171.

An interlayer insulating film 18 is disposed in all area of the principal surface of the substrate 2 containing the wiring 17. For example, an SiO$_2$ film, particularly, a TEOS film that can be formed at low temperature and has dense film quality can be used as the interlayer insulating film 18. A tenth plug 19 buried in a connection hole 181 formed in the interlayer insulating film 18 is disposed on the wiring 17 in the interlayer insulating film 18. For example, a W film can be used as the tenth plug 19.

Wiring (third layer metal wiring) 20 electrically connected to the tenth plug 19 is disposed on the interlayer insulating film 18. In the fourth embodiment, the wiring 20 includes a barrier metal film 201 and a wiring main body 202 on the barrier metal film 201. For example, a deposition film having a Ti film and a TiN film deposited on the Ti film can be used as the barrier metal layer 201. For example, an Al film or an Al alloy film can be used as the wiring main body 202.

[Method for Manufacturing Ferroelectric Random Access Memory]

Next, a method for manufacturing the ferroelectric random access memory 1 according to the fourth embodiment described above will be discussed with FIGS. 19 to 31.

Figure 19:
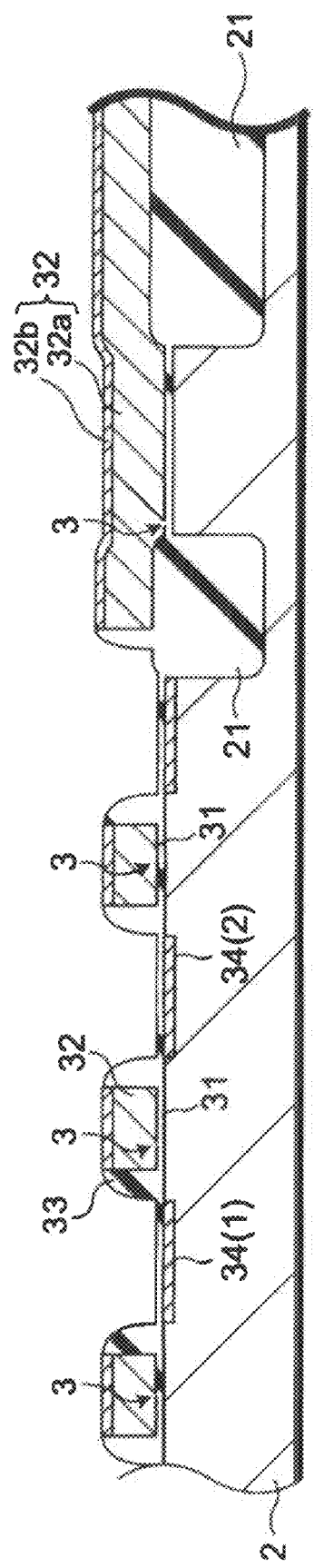
FIG. 19 is a sectional view to describe a first process step of a method for manufacturing the ferroelectric random access memory according to the fourth embodiment.

First, a substrate 2 is provided. Element isolation regions 21 are formed on the principal surface of an inactive region of the substrate 2 (see FIG. 19). The element isolation region 21 is formed of an SiO$_2$ film (LOCOS) provided by selectively thermally oxidizing the principal surface of the substrate 2 and growing the film thickness. As shown in FIG. 19, transistors 3 are formed using planar technique. To form the transistor 3, first a gate insulating film 31 is formed and subsequently an Si polycrystalline film 32a of a lower layer of a control electrode 32 and a side wall spacer 33 are formed in order. Further, a high melting point metal silicide film 32b of an upper layer of the control electrode 32, a first main electrode 34 (1) and a second main electrode 34 (2) are formed using salicide technique and the transistor 3 can be completed.

Figure 20:
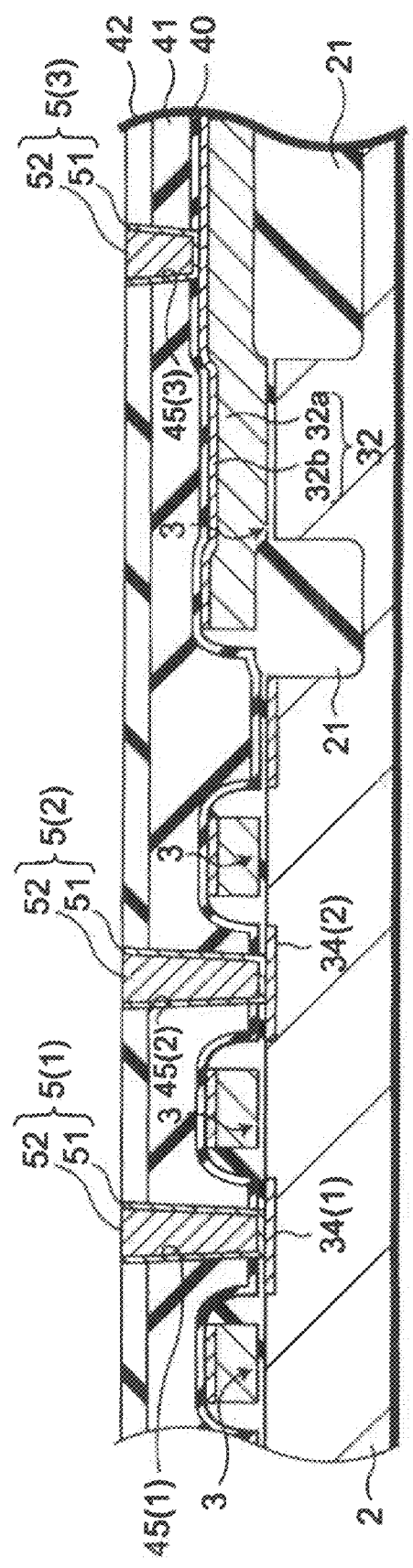
FIG. 20 is a sectional view to describe a second process step.

An insulating film 40 is formed in all area of the principal surface of the substrate 2 containing the transistors 3, more particularly the high melting point metal silicide films 32b of the control electrodes 32, the first main electrodes 34 (1) and the second main electrodes 34 (2) (see FIG. 20). An Si$_3$N$_4$ film formed by an LP-CVD method or a plasma CVD method and having a film thickness of about several ten nm can be used as the insulating film 40. Subsequently, insulating films 41 and 42 are formed in order on the insulating film 40. A BPSG film is used as the insulating film 41 for the purpose of flattening, for example, and a TEOS film is used as the insulating film 42.

In the insulating films 40, 41 and 42, a connection hole 45 (1) is formed on the first main electrode 34 (1), a connection hole 45 (2) is formed on the second main electrode 34 (2), and a connection hole 45 (3) is formed on the control electrode 32 (see FIG. 20). The connection holes 45 (1) to 45 (3) are formed by an anisotropic etching of RIE, etc., using a mask formed by a photolithography technique. This means that the connection holes 45 (1) to 45 (3) are formed in the same manufacturing step. In the method for manufacturing the ferroelectric random access memory 1 according to the fourth embodiment, the connection holes 45 (1), 45 (2) and 45 (3) are formed within the insulating films 40, 41 and 42 in the interlayer insulating film 4. Therefore, the depth of each of the connection holes 45 (1), 45 (2) and 45 (3) is made shallow and the aspect ratio of the ratio of the depth to the opening dimension can be reduced.

As shown in FIG. 20, a first plug 5 (1) electrically connected to the first main electrode 34 (1) is formed in the connection hole 45 (1). In the same manufacturing step, a second plug 5 (2) electrically connected to the second main electrode 34 (2) is formed in the connection hole 45 (2) and the third plug 5 (3) electrically connected to the control electrode 32 is formed in the connection hole 45 (3). To form the first plug 5 (1), the second plug 5 (2) and the third plug 5 (3), a barrier film 51 is formed on the side walls and the bottom faces of the connection holes 45 (1) to 45 (3) and a burying conductor 52 is formed on the barrier film 51 and then excessive barrier film 51 and burying conductor 52 are removed using a CMP method.

Figure 21:
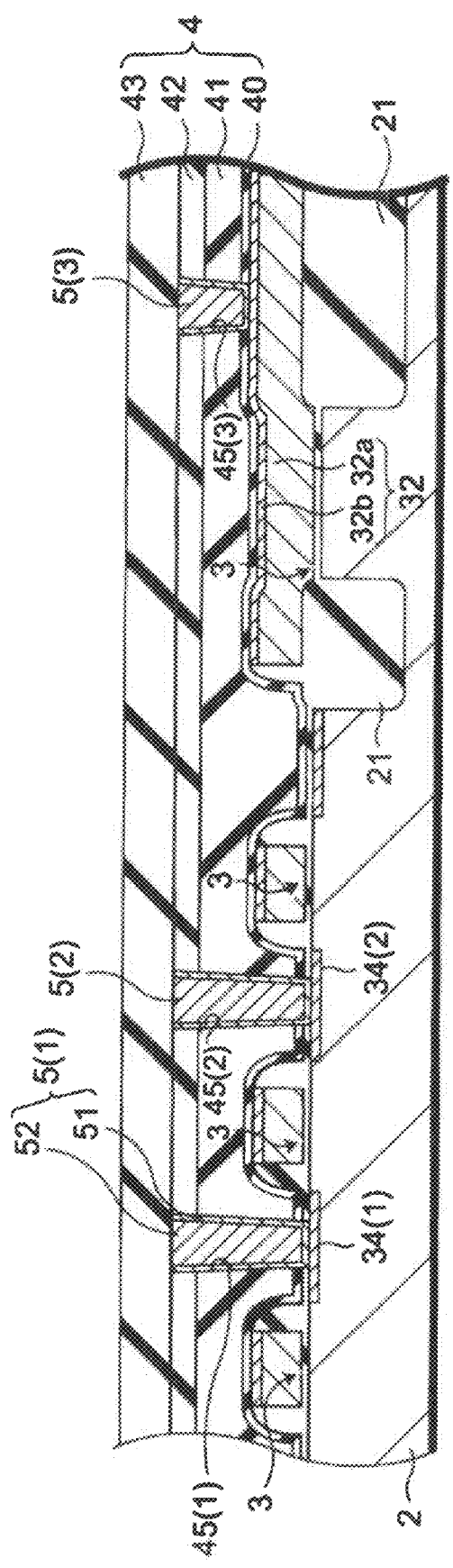
FIG. 21 is a sectional view to describe a third process step.

As shown in FIG. 21, an insulating film 43 is formed in all area of the principal surface of the substrate 2 containing the first plug 5 (1), the second plug 5 (2), the third plug 5 (3) and the insulating film 42. For example, a TEOS film can be used as the insulating film 43; preferably, a deposition film having an Si$_3$N$_4$ film formed at low pressure and a TEOS film formed at low pressure on the Si$_3$N$_4$ film can be used. The insulating film 43 is formed, whereby the interlayer insulating film 4 having the insulating films 40, 41, 42 and 43 is formed.

Figure 22:
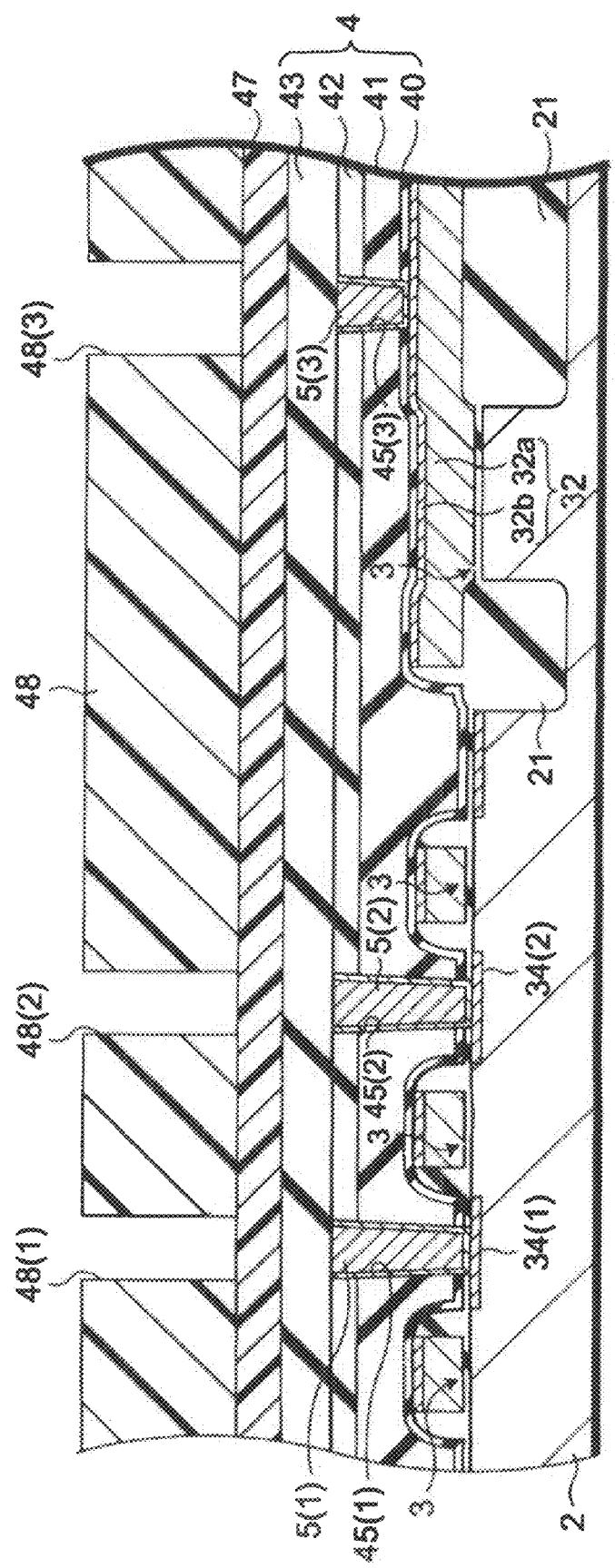
FIG. 22 is a sectional view to describe a fourth process step.

A reflection prevention (organic arc) film 47 is formed on the insulating film 43 and as shown in FIG. 22, a mask having openings 48 (1), 48 (2) and 48 (3) is formed on the reflection prevention film 47. A photoresist film formed by the photolithography technique is used as the mask 48. The opening 48 (1) of the mask 48 is disposed on the first plug 5 (1) on the first main electrode 34 (1). The opening 48 (2) is disposed on the second plug 5 (2) on the second main electrode 34 (2). In the fourth embodiment, the opening dimension of the opening 48 (1) is set to the same as the opening dimension of the connection hole 45 (1) in which the first plug 5 (1) is disposed, and the opening dimension of the opening 48 (2) is set to the same as the opening dimension of the connection hole 45 (2) in which the second plug 5 (2) is disposed.

The opening 48 (3) is disposed on the third plug 5 (3) on the control electrode 32. The opening dimension of the opening 48 (3) is set large as compared with the opening dimension of the connection hole 45 (3) in which the third plug 5 (3) is disposed. More particularly, the opening dimension of the opening 48 (3) is set to be larger than that of a second connection hole 101 (2) to be formed in the barrier film 10 on the interlayer insulating film 4 and that of a connection hole 111 in which a fifth plug 12 (2) is to be disposed. The dimension difference therebetween is larger than at least the alignment allowance dimension of manufacturing. That is, the position of the second connection hole 101 (2) to be formed in the barrier film 10 is determined within the range of the top face of an eleventh plug 6 (3) later formed. If the position of the second connection hole 101 (2) is placed beyond the range of the top face of the eleventh plug 6 (3), unnecessary penetration occurs in the interlayer insulating film 4 when the second connection hole 101 (2) is formed.

Figure 23:
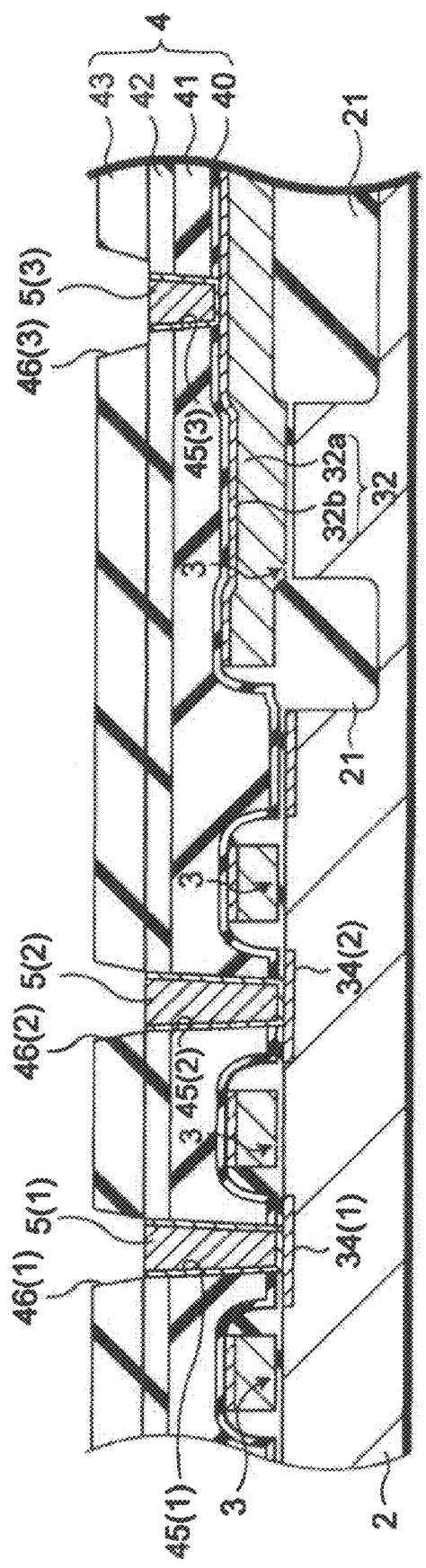
FIG. 23 is a sectional view to describe a fifth process step.

Using the mask 48, the reflection prevention film 47 exposed from the opening 48 (1) of the mask 48 and the insulating film 43 are removed and a connection hole 46 (1) is formed (see FIG. 23). In the same manufacturing step, the reflection prevention film 47 exposed from the opening 48 (2) and the insulating film 43 are removed to form a connection hole 46 (2), and the reflection prevention film 47 exposed from the opening 48 (3) and the insulating film 43 are removed to form a connection hole 46 (3). To form the connection holes 46 (1) to 46 (3), anisotropic etching of RIE, etc., can be used. The opening dimension of the opening 48 (3) of the mask 48 is set larger by an alignment allowance dimension and thus the opening dimension of the connection hole 46 (3) is formed large in accordance with the opening dimension of the opening 48 (3). The mask 48 and the reflection prevention film 47 are removed as shown in FIG. 23.

Figure 24:
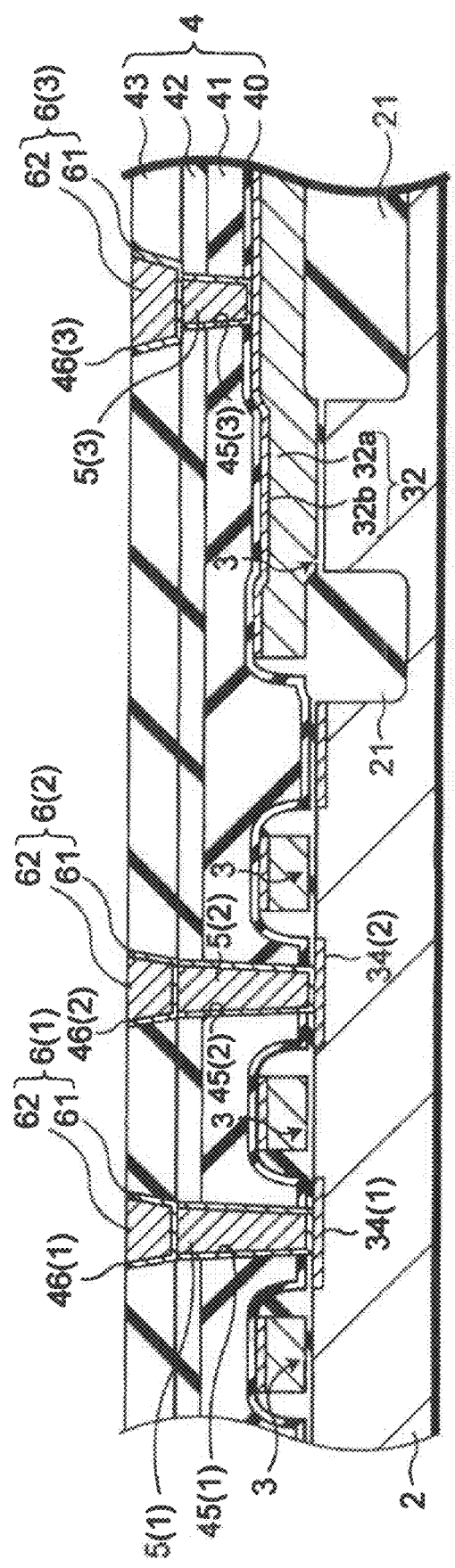
FIG. 24 is a sectional view to describe a sixth process step.

As shown in FIG. 24, a sixth plug 6 (1) is formed in the connection hole 46 (1) and a seventh plug 6 (2) is formed in the connection hole 46 (2). In the same manufacturing step, the eleventh plug 6 (3) is formed in the connection hole 46 (3). Each of the sixth plug 6 (1), the seventh plug 6 (2) and the eleventh plug 6 (3) is formed of a barrier metal layer 61 and a burying conductor 62 formed on the barrier metal layer 61. The barrier metal layer 61 is formed by a sputtering method or a CVD method, for example, and the burying conductor 62 is formed by the CVD method, for example. Excessive barrier film 61 and burying conductor 62 are removed using the CMP method.

Figure 25:
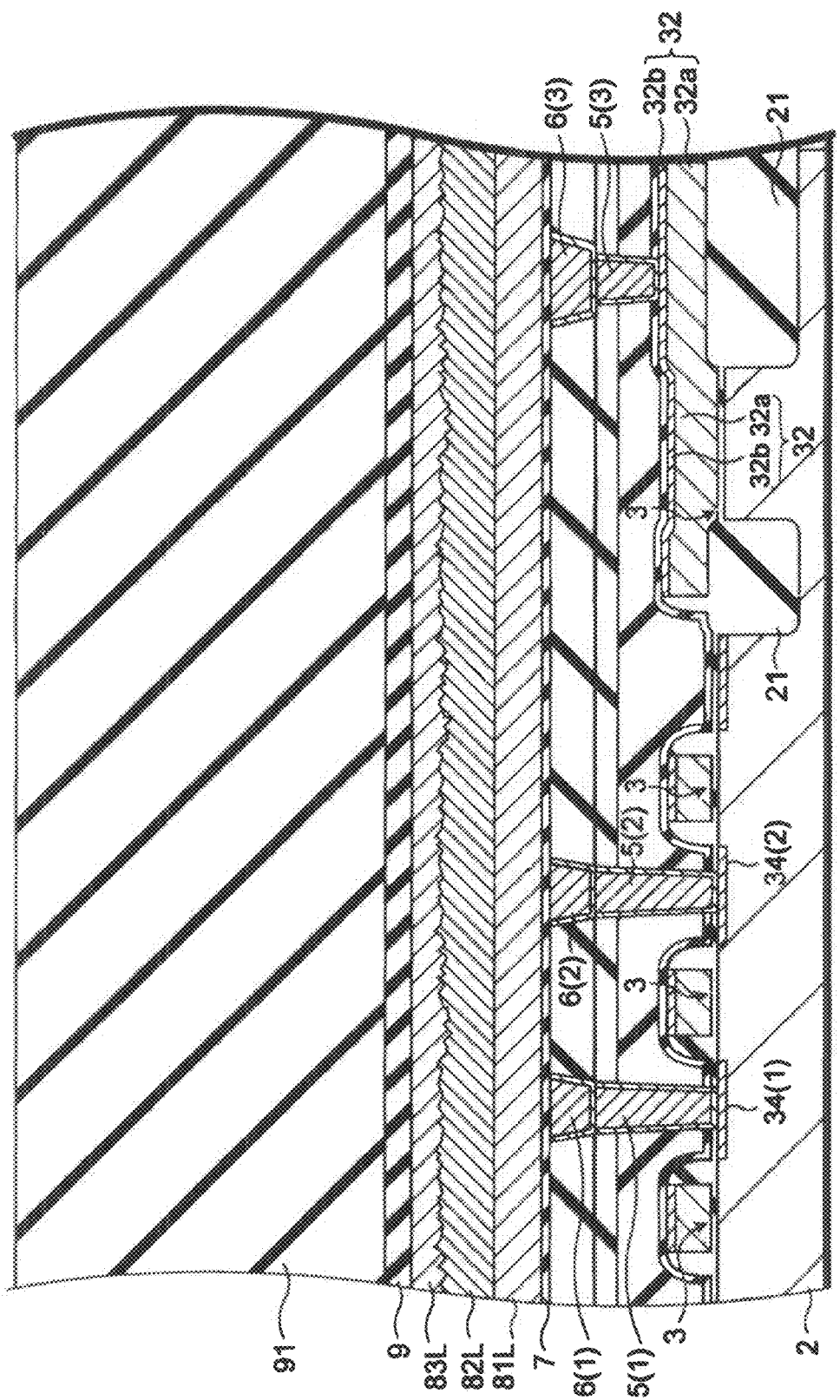
FIG. 25 is a sectional view to describe a seventh process step.

Next, to manufacture ferroelectric capacitors 8, a barrier film 7, a first electrode film 81L, a ferroelectric film 82L, a second electrode film 83L, a barrier film 9 and a mask 91 are deposited in order in all area on the interlayer insulating film 4 (insulating film 43) containing at least the sixth plugs 6 (1), as shown in FIG. 25. For example, a TiAlN film formed by the sputtering method can be used as the barrier film 7. For example, an Ir film formed by the sputtering method can be used as the first electrode film 81L. For example, a PZT film or an SBT film formed by the sputtering method, an MOCVD method, a sol-gel method, or the like can be used as the ferroelectric film 82L. For example, an $IrO_2$ film formed by the sputtering method can be used as the second electrode film 83L. For example, an $Al_2O_3$ film formed by the sputtering method can be used as the barrier film 9. A TEOS film formed by the plasma CVD method can be used as the mask 91.

Figure 26:
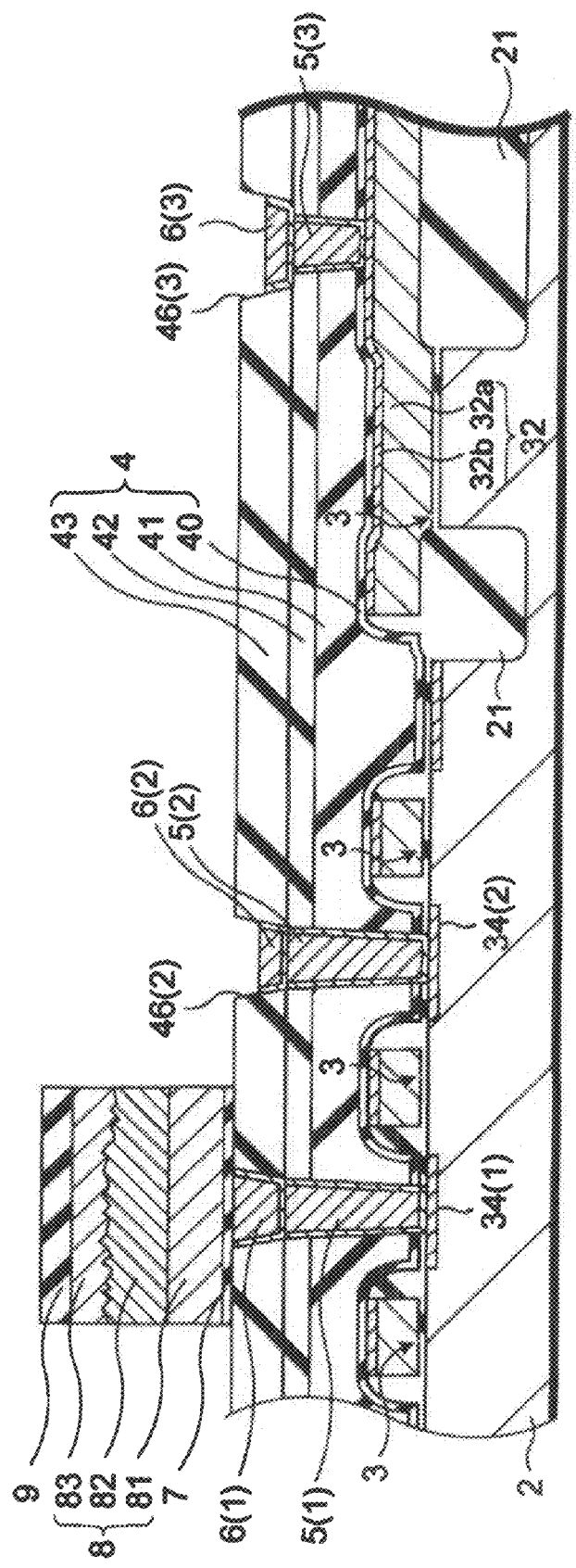
FIG. 26 is a sectional view to describe an eighth process step.

The mask 91 is patterned using the photolithography technique and the etching technique, whereby the mask 91 for patterning the ferroelectric capacitors 8 is formed. The mask 91 exists in the formation regions of the ferroelectric capacitors 8 and does not exist in any other region. The mask 91 is used to pattern the barrier film 9, the second electrode film 83L, the ferroelectric film 82L, the first electrode film 81L, and the barrier film 7, in top-to-bottom order (see FIG. 26). Then, the mask 91 is removed, whereby the ferroelectric capacitor 8 having an electrode 83 patterned from the second electrode film 83L, a ferroelectric 82 patterned from the ferroelectric film 82L, and an electrode 81 patterned from the first electrode film 81L can be completed as shown in FIG. 26. To pattern the mask 91, the barrier film 9, the second electrode film 83L, the ferroelectric film 82L, the first electrode film 81L, and the barrier film 7, for example, anisotropic etching of RIE, etc., can be used.

Figure 27:
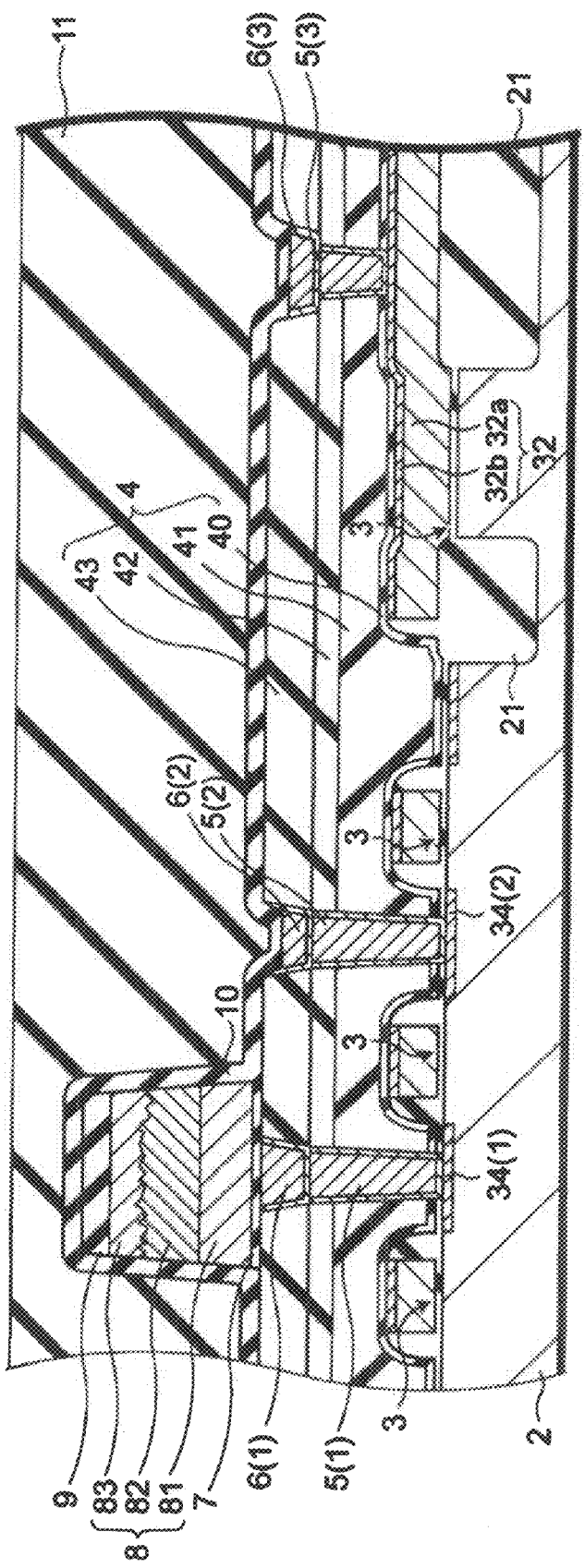
FIG. 27 is a sectional view to describe a ninth process step.

As shown in FIG. 27, a barrier film 10 is formed to cover the ferroelectric capacitor 8 and the interlayer insulating film 4. In the ferroelectric capacitor 8, the sides of the electrode 81, the sides of the ferroelectric film 82, the sides of the electrode 83, the sides of the barrier film 7 and the sides and the top face of the barrier film 9 are covered by the barrier film 10. For example, the barrier film 10 is formed of an $Al_2O_3$ film and is functioning as a hydrogen barrier. For example, the $Al_2O_3$ film is formed by the sputtering method, an atomic layer deposition (ALD) method, or the like. An interlayer insulating film 11 is formed on the barrier film 10 as shown in FIG. 27. For example, a TEOS film formed by the plasma CVD method can be used as the interlayer insulating film 11 and the surface of the TEOS film is formed and then is ground and flattened by the CMP method.

Figure 28:
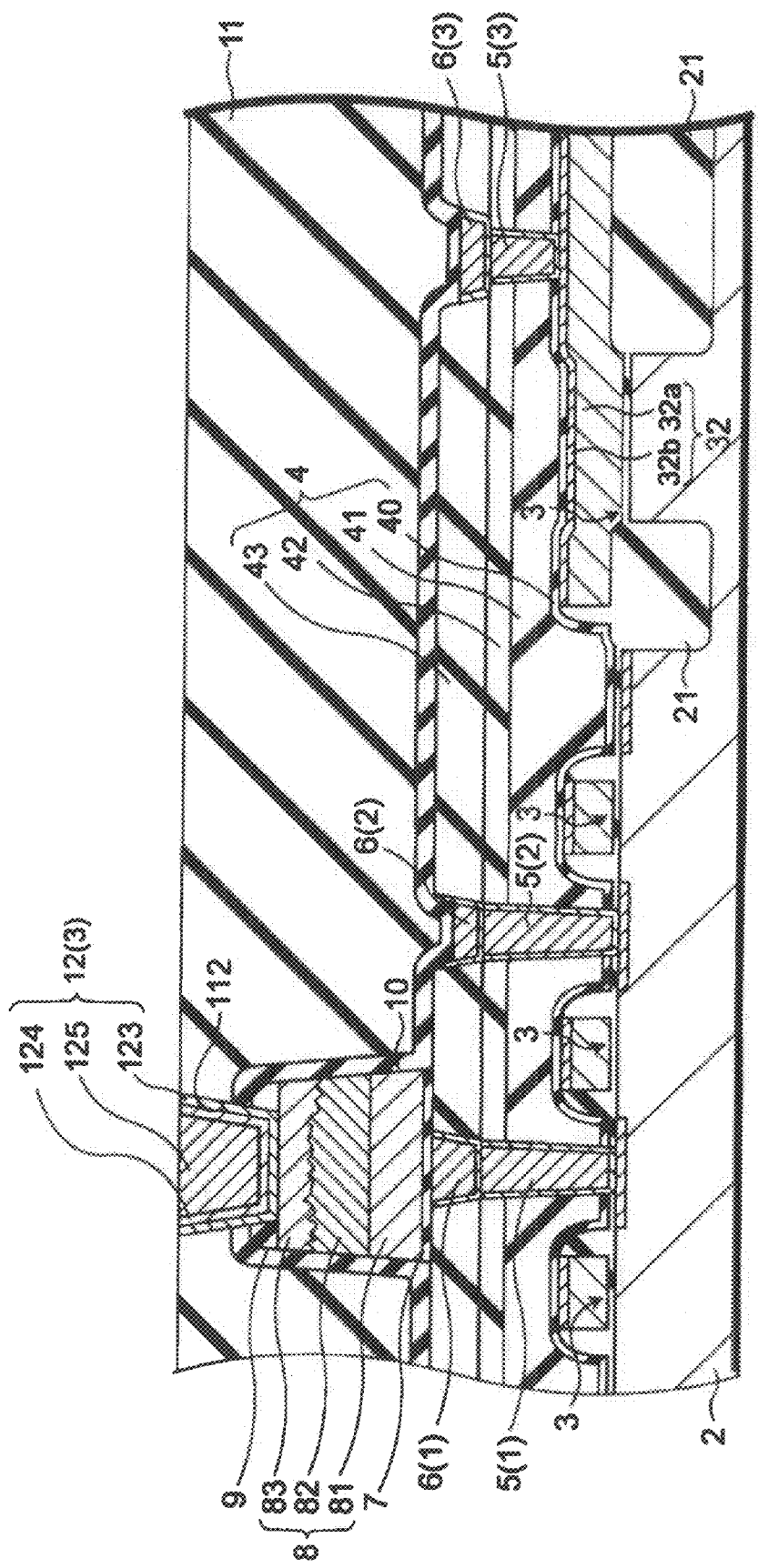
FIG. 28 is a sectional view to describe a tenth process step.

The interlayer insulating film 11 and the barrier films 10 and 9 are partially removed on the electrode 83 of each ferroelectric capacitor 8 to form a connection hole 112 (see FIG. 28). The connection hole 112 can be formed by forming a mask by the photolithography technique and executing anisotropic etching of RIE, etc., for the interlayer insulating film 11, etc., using the mask. An eighth plug 12 (3) is formed in the connection hole 112 as shown in FIG. 28. The eighth plug 12 (3) includes a barrier metal layer 123, an intermediate film 124 and a burying conductor 125. For example, a TiN film formed by the sputtering method can be used as the barrier metal layer 123. For example, an NbN film formed by the sputtering method can be used as the intermediate film 124. For example, an Al film formed by a reflow sputtering method can be used as the burying conductor 125. Excessive barrier film 123, intermediate film 124 and burying conductor 125 are ground by the CMP method and the eighth plug 12 (3) is buried in the connection hole 112.

Figure 29:
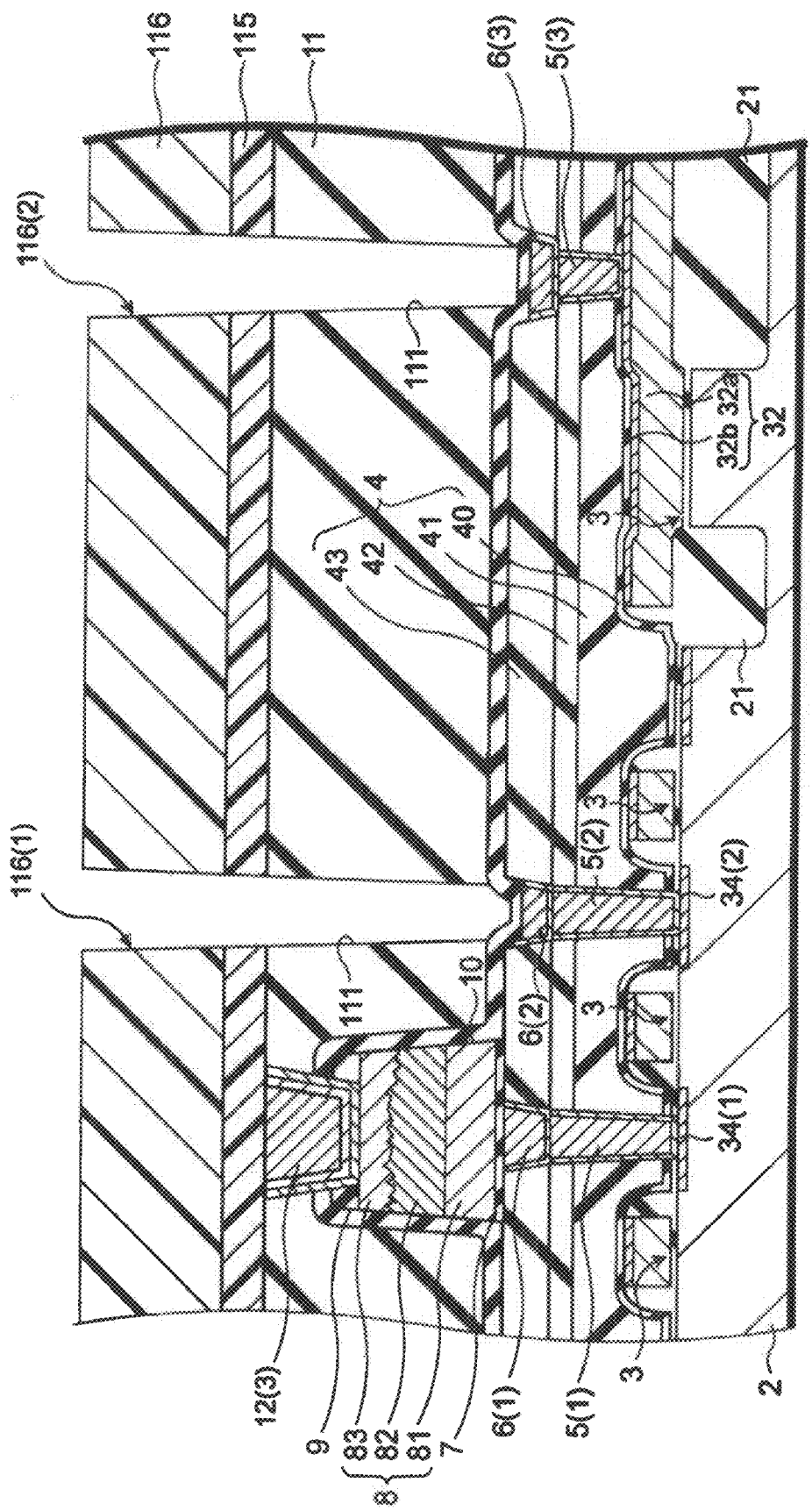
FIG. 29 is a sectional view to describe an eleventh process step.

A reflection prevention film 115 and a mask 116 are deposited in order on the interlayer insulating film 11 (see FIG. 29). The mask 116 is formed with an opening 116 (1) above the second plug 5 (2) and on the seventh plug 6 (2) and is formed with an opening 116 (2) above the third plug 5 (3) and on the eleventh plug 6 (3). A photoresist film is used as the mask 116. Using the mask 116, portions of the reflection prevention film 115 exposed from the openings 116 (1) and 116 (2) are removed, and further the interlayer insulating film 11 is etched to form a connection hole 111 therein as shown in FIG. 29. To form the connection hole 111, the barrier film 10 below the interlayer insulating film 11 is used as an etching stopper layer. RIE using a CF-based gas can be used as the etching.

Figure 30:
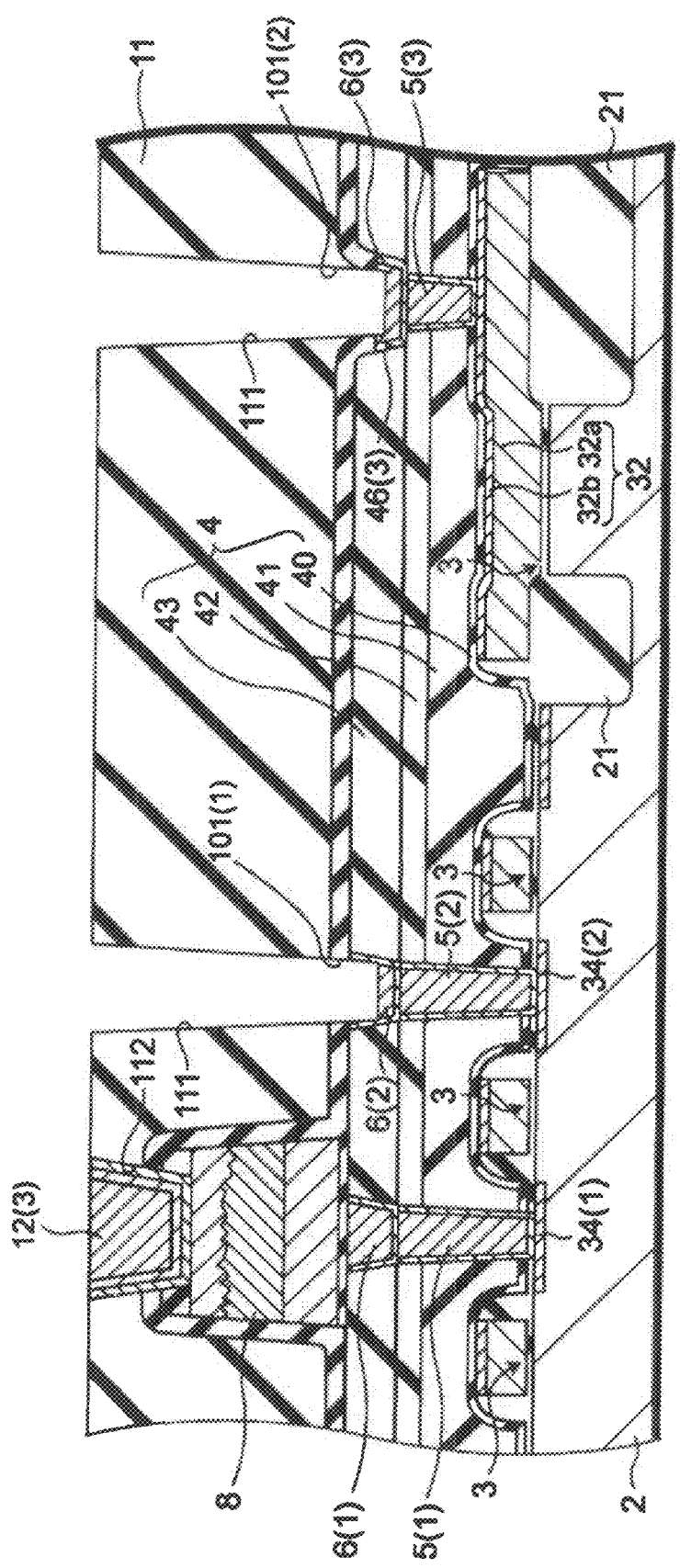
FIG. 30 is a sectional view to describe a twelfth process step.

As shown in FIG. 30, subsequently the barrier film 10 exposed from the connection hole 111 on the seventh plug 6 (2) is selectively removed to form a first connection hole 101 (1), and the barrier film 10 exposed from the connection hole 111 on the eleventh plug 6 (3) is selectively removed to form a second connection hole 101 (2). To form the first connection hole 101 (1) and the second connection hole 101 (2), for example, RIE using a Cl-based gas can be used.

The third plug 5 (3) buried in the connection hole 45 (3) formed in the insulating films 40, 41 and 42 and the eleventh plug 6 (3) buried in the connection hole 46 (3) formed in the insulating film 43 are deposited on the control electrode 32 of the transistor 3. That is, the third plug 5 (3) and the eleventh plug 6 (3) are deposited between the control electrode 32 and the barrier film 10, whereby the aspect ratio can be reduced in each plug while the whole plug height (length) is enlarged.

The eleventh plug 6 (3) having the large opening dimension as compared with the opening dimension of the third plug 5 (3) is disposed on the third plug 5 (3) on the control electrode 32. That is, the position of the second connection hole 101 (2) in the barrier film 10 is determined within the range of the eleventh plug 6 (3) and thus the interlayer insulating film 4 below the barrier film 10 is not exposed to the second connection hole 101 (2). Therefore, to form the second connection hole 101 (2), unnecessary removal of the interlayer insulating film 4, namely, penetration does not occur.

Subsequently, a fourth plug 12 (1) is buried in the first connection hole 101 (1) of the barrier 10 and the connection hole 111 communicating therewith, and a fifth plug 12 (2) is buried in the second connection hole 101 (2) and the connection hole 111 communicating therewith (see FIG. 31). Each of the fourth plug 12 (1) and the fifth plug 12 (2) has a barrier film 121 and a burying conductor 122 deposited on the barrier film 121.

Figure 31:
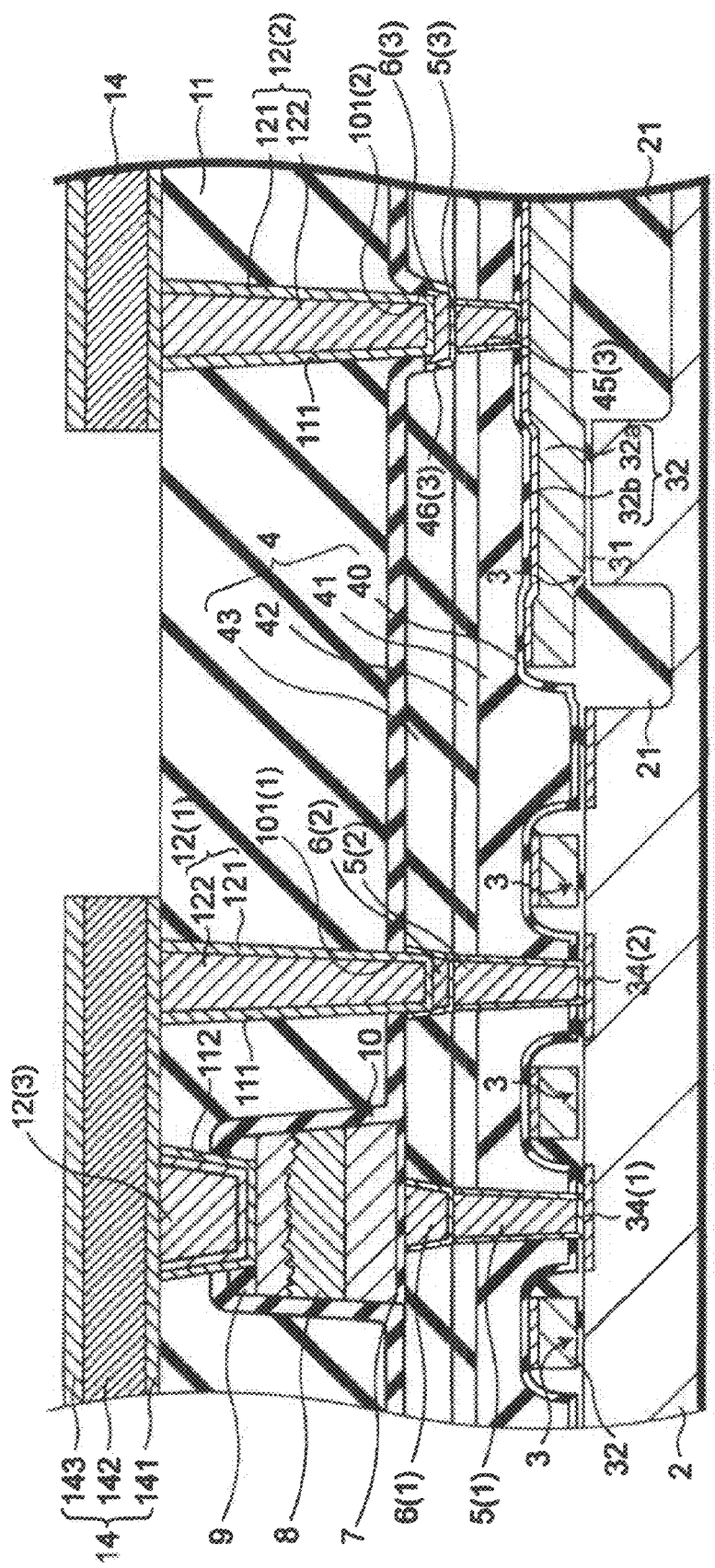
FIG. 31 is a sectional view to describe a thirteenth process step.

As shown in FIG. 31, wiring 14 electrically connected to the eighth plug 12 (3) and the fourth plug 12 (1) and wiring 14 electrically connected to the fifth plug 12 (2) are formed on the interlayer insulating film 11. The wiring 14 is formed by forming a barrier metal layer 141, a wiring main body 142 and a barrier metal film 143 in order and then patterning, as described above.

Subsequently, an interlayer insulating film 15 is formed in all area of the principal surface of the substrate 2 containing the wiring 14 (see FIG. 18). In the interlayer insulating film 15, a connection hole 151 is formed on the wiring 14. Next, a ninth plug 16 is buried in the connection hole 151. Wiring 17 electrically connected to the ninth plug 16 is formed on the interlayer insulating film 15 as shown in FIG. 18. The wiring 17 is formed by forming a barrier metal layer 171, a wiring main body 172 and a barrier metal film 173 in order and then patterning, as described above.

Subsequently, an interlayer insulating film 18 is formed in all area of the principal surface of the substrate 2 containing the wiring 17 (see FIG. 18). In the interlayer insulating film 18, a connection hole 181 is formed on the wiring 17. Next, a tenth plug 19 is buried in the connection hole 181. Wiring 20 electrically connected to the tenth plug 19 is formed on the interlayer insulating film 18 as shown in FIG. 18. The wiring 20 is formed by forming a barrier metal layer 201 and a wiring main body 202 in order and then patterning, as described above. When the manufacturing process terminates, then the ferroelectric random access memory 1 according to the fourth embodiment can be completed.

Modified Example

Figure 32:
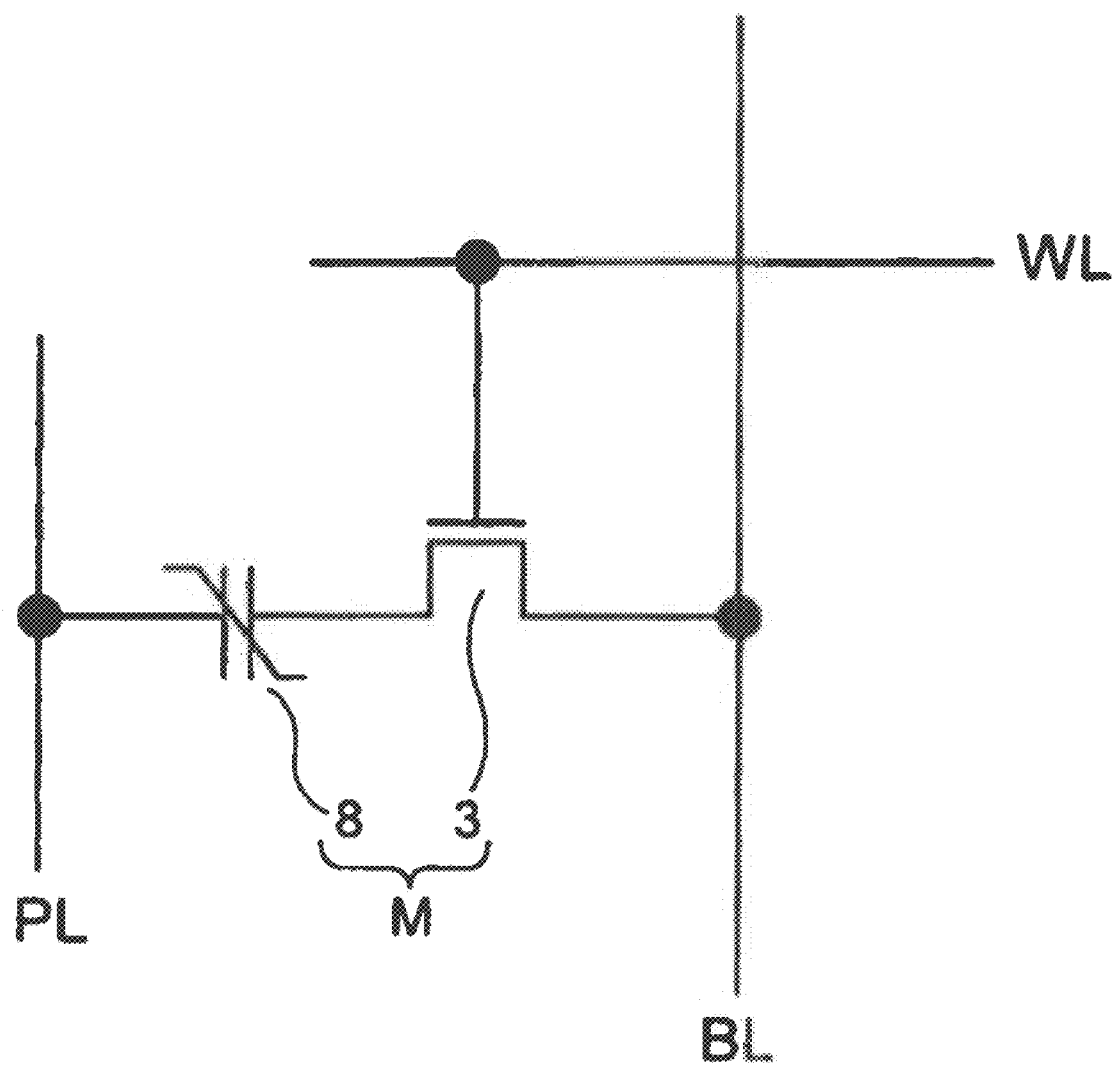
FIG. 32 is a circuit diagram to show another circuit configuration of the ferroelectric random access memory according to the embodiment.

In the description of the ferroelectric random access memory 1 according to the fourth embodiment, the Chain-FeRAM™ structure adopted by way of example, but the invention is not limited to the Chain-FeRAM™ structure and can also be applied to another FeRAM structure. In ferroelectric random access memory 1 adopting the modified example of the fourth embodiment, a memory cell M for storing one-bit information is placed in a crossing point of a bit line BL and a plate line PL and a word line WL as shown in FIG. 32. The memory cell M is implemented as a series circuit made up of a transistor 3 and a ferroelectric capacitor 8. FIG. 32 shows only one 1-bit memory cell M; in fact, however, a plurality of memory cells M are arranged like a matrix along the extension direction of the bit line BL and the extension direction of the word line WL.

As described above, in the ferroelectric random access memory 1 according to the fourth embodiment, the third plug 5 (3) and the eleventh plug 6 (3) are deposited between the control electrode 32 of the transistor 3 and the barrier film 10 and the plug height can be made high (the plug length can be made long) to provide a distance, so that penetration to the control electrode 32 when the second connection hole 101 (2) is formed in the barrier film 10 can be prevented. The plug between the control electrode 32 of the transistor 3 and the barrier film 10 is divided into the third plug 5 (3) and the eleventh plug 6 (3), whereby the aspect ratio between the connection hole 45 (3) in which the third plug 5 (3) is buried and the connection hole 46 (3) in which the eleventh plug 6 (3) is buried can be reduced and the step coverage of the barrier metal films 51 and 61 can be improved. Similar comments also apply to the first plug 5 (1) and the sixth plug 6 (1) on the first main electrode 34 (1) of the transistor 3 and the second plug 5 (2) and the seventh plug 6 (2) on the second main electrode 34 (2) of the transistor 3. Between the control electrode 32 of the transistor 3 and the barrier film 10, the bottom face area of the eleventh plug 6 (3) is set larger than the top face area of the third plug 5 (3). Specifically, the bottom face area of the eleventh plug 6 (3) is increased by more than the alignment allowance dimension with respect to the top face area of the third plug 5 (3), so that penetration caused by misalignment between the eleventh plug 6 (3) and the second connection hole 101 (2) of the barrier film 10 can be prevented. Therefore, a contact connection failure on the first main electrode 34 (1) and the second main electrode 34 (2) of the transistor 3 and a contact connection failure on the control electrode 32 can be prevented.

Other Embodiments

It is to be understood that the invention is not limited to the specific embodiments described above. For example, the ferroelectric random access memory 1 is described in the embodiments, but the semiconductor device of the invention need not necessarily include a storage circuit and the invention can be applied widely to a semiconductor device including a logical circuit having the transistors 3 and the ferroelectric capacitors. In the embodiments described above, IGFET is used as the transistor 3, but a bipolar transistor can be used as the transistor 3 in the invention.

Further, in the fourth embodiment, the connection hole 46 (2) in which the seventh plug 6 (2) is disposed may be formed large similar to the connection hole 46 (3) in which the eleventh plug 6 (3) is formed.

According to an aspect of the present invention, there is provided a semiconductor device including transistors and ferroelectric capacitors for making it possible to prevent a contact connection failure on a main electrode of the transistor and a contract connection failure on a control electrode.

What is claimed is:

1. A semiconductor device comprising:
   a transistor including:
      a first main electrode,
      a second main electrode, and
      a control electrode;
   a first plug that is disposed on the first main electrode;
   a second plug that is disposed on the second main electrode;
   a third plug that is disposed on the control electrode;
   an interlayer insulating film that is disposed to cover the transistor, the first plug, the second plug and the third plug;
   a ferroelectric capacitor including:
      a first electrode that is disposed on the interlayer insulating film and is electrically connected to the first plug,
      a second electrode that is separated from the first electrode, and
      a ferroelectric film that is disposed between the first electrode and the second electrode;

a barrier film that covers a surface of the ferroelectric capacitor and a surface of the interlayer insulating film and prevents a substance affecting a crystalline composition or a polarization characteristic of a ferroelectric from entering therethrough;

a fourth plug that is disposed on the second plug and is electrically connected to the second plug through a first connection hole disposed in the barrier film;

an eleventh plug that is disposed on the third plug below the barrier film;

a fifth plug that is disposed on the eleventh plug and is electrically connected to the eleventh plug through a second connection hole disposed in the barrier film; and wherein a bottom face area of the eleventh plug is larger than a top face area of the third plug.

2. A semiconductor device comprising:
a transistor including:
  a first main electrode,
  a second main electrode, and
  a control electrode;
a first plug that is disposed on the first main electrode;
a second plug that is disposed on the second main electrode;
a third plug that is disposed on the control electrode;
an interlayer insulating film that is disposed to cover the transistor, the first plug, the second plug and the third plug;
a ferroelectric capacitor including:
  a first electrode that is disposed on the interlayer insulating film and is electrically connected to the first plug,
  a second electrode that is separated from the first electrode, and
  a ferroelectric film that is disposed between the first electrode and the second electrode;
a barrier film that covers a surface of the ferroelectric capacitor and a surface of the interlayer insulating film and prevents a substance affecting a crystalline composition or a polarization characteristic of a ferroelectric from entering therethrough;
a fourth plug that is disposed on the second plug and is electrically connected to the second plug through a first connection hole disposed in the barrier film;
an eleventh plug that is disposed on the third plug below the barrier film;
a fifth plug that is disposed on the eleventh plug and is electrically connected to the eleventh plug through a second connection hole disposed in the barrier film; and
wherein a bottom face area of the eleventh plug is larger by an alignment allowance dimension than a top face area of the third plug.

* * * * *